(12) United States Patent
Nair et al.

(10) Patent No.: US 11,599,359 B2
(45) Date of Patent: Mar. 7, 2023

(54) METHODS AND SYSTEMS FOR UTILIZING A MASTER-SHADOW PHYSICAL REGISTER FILE BASED ON VERIFIED ACTIVATION

(71) Applicant: ADVANCED MICRO DEVICES, INC., Santa Clara, CA (US)

(72) Inventors: Arun A. Nair, Santa Clara, CA (US); Ashok T. Venkatachar, Santa Clara, CA (US); Emil Talpes, Santa Clara, CA (US); Srikanth Arekapudi, Santa Clara, CA (US); Rajesh Kumar Arunachalam, Santa Clara, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/877,112

(22) Filed: May 18, 2020

(65) Prior Publication Data

US 2021/0357222 A1 Nov. 18, 2021

(51) Int. Cl.
*G06F 9/30* (2018.01)
*G06F 9/38* (2018.01)

(52) U.S. Cl.
CPC ...... *G06F 9/30116* (2013.01); *G06F 9/30029* (2013.01); *G06F 9/30047* (2013.01); *G06F 9/30101* (2013.01); *G06F 9/384* (2013.01); *G06F 9/3857* (2013.01)

(58) Field of Classification Search
CPC .... G06F 9/30116; G06F 9/384; G06F 9/3857; G06F 9/30047; G06F 9/30029; G06F 9/30101; G06F 9/3863; G11C 7/1036; G11C 19/00

USPC .................................................. 712/217, 220
See application file for complete search history.

(56) References Cited

U.S. PATENT DOCUMENTS

| 5,986,962 | A | 11/1999 | Bertin et al. |
|---|---|---|---|
| 6,240,031 | B1 | 5/2001 | Mehotra et al. |
| 6,298,431 | B1 | 10/2001 | Gottlieb |
| 6,608,775 | B2 | 8/2003 | Lu |
| 6,810,475 | B1 * | 10/2004 | Tardieux ............... G06F 9/3867 712/217 |
| 6,877,084 | B1 | 4/2005 | Christie |

(Continued)

FOREIGN PATENT DOCUMENTS

| KR | 10-2010-0094201 | 8/2010 |
|---|---|---|
| KR | 10-2011-0127757 | 11/2011 |

OTHER PUBLICATIONS

International Search Report and Written Opinion for counterpart Application No. PCT/US2020/052756, dated Dec. 30, 2020 12 pages.

(Continued)

*Primary Examiner* — Shawn Doman

(57) ABSTRACT

A processor in a data processing system includes a master-shadow physical register file and a renaming unit. The master-shadow physical register file has a master storage coupled to shadow storage. The renaming unit is coupled to the master-shadow physical register file. Based on an occurrence of shadow transfer activation conditions verified by the renaming unit, data in the master storage is transferred from the master storage to the shadow storage for storage. Data is transferred from the shadow storage back to the master storage based on the occurrence of a shadow-to-master transfer event, which includes, for example, a flush of the master storage by the processor.

17 Claims, 5 Drawing Sheets

(56) References Cited

U.S. PATENT DOCUMENTS

| | | | | |
|---|---|---|---|---|
| 7,069,411 | B1* | 6/2006 | McMinn | G06F 9/3836 711/202 |
| 7,398,347 | B1 | 7/2008 | Pechanek | |
| 8,140,829 | B2 | 3/2012 | Eickemeyer et al. | |
| 9,639,369 | B2 | 5/2017 | Blasco | |
| 2001/0047468 | A1 | 11/2001 | Parady | |
| 2002/0087837 | A1 | 7/2002 | Samra et al. | |
| 2002/0144090 | A1* | 10/2002 | Ronen | G06F 9/384 712/217 |
| 2003/0023836 | A1 | 1/2003 | Catherwood et al. | |
| 2003/0172256 | A1 | 9/2003 | Soltis, Jr. et al. | |
| 2004/0133766 | A1* | 7/2004 | Abraham | G06F 9/30076 712/217 |
| 2004/0172522 | A1 | 9/2004 | Biswas et al. | |
| 2005/0041450 | A1 | 2/2005 | Duh et al. | |
| 2005/0066096 | A1* | 3/2005 | Ruemmler | G06F 9/3863 710/200 |
| 2005/0081018 | A1 | 4/2005 | Luick | |
| 2005/0138323 | A1 | 6/2005 | Snyder | |
| 2006/0288190 | A1 | 12/2006 | Shoemaker | |
| 2006/0294344 | A1 | 12/2006 | Hsu et al. | |
| 2007/0106885 | A1* | 5/2007 | Rychlik | G06F 9/30123 712/228 |
| 2007/0294515 | A1 | 12/2007 | Luck | |
| 2008/0209184 | A1 | 8/2008 | Ahmed et al. | |
| 2008/0209185 | A1 | 8/2008 | Ahmed | |
| 2009/0231935 | A1 | 9/2009 | Golla et al. | |
| 2010/0205387 | A1 | 8/2010 | Sun et al. | |
| 2011/0004644 | A1 | 1/2011 | Henry | |
| 2011/0241744 | A1 | 10/2011 | Moudgill et al. | |
| 2013/0275700 | A1 | 10/2013 | Wang et al. | |
| 2016/0086678 | A1 | 3/2016 | Botea et al. | |
| 2016/0371087 | A1* | 12/2016 | Le | G06F 9/3861 |
| 2017/0060593 | A1* | 3/2017 | Krishna | G06F 9/384 |
| 2019/0080737 | A1 | 3/2019 | Nguyen et al. | |

OTHER PUBLICATIONS

International Search Report and Written Opinion for PCT/US2020/057945 dated Feb. 16, 2021, 10 pages.

Takuya Edamatsu et al., "Acceleration of Large Integer Multiplication with Intel AVX-512 Instructions", 2018 IEEE 20th International Conference on High Performance Computing and Communications; IEEE 16th International Conference on Smart City; IEEE 4th Intl. Conference on Data Science and Systems, Jun. 1, 2018, 8 pages.

Non-Final Office Action dated Jan. 25, 2021 for U.S. Appl. No. 16/585,817, 22 pages.

Jason Cong et al., "Instruction Set Extension with Shadow Registers for Configurable Processors", Proceedings of the 2005 ACM/SIGDA 13th International Symposium on Field-programmable Gate Arrays (FPGA '05), Feb. 1, 2005, 8 pages.

Ergin, Oguz, et al., "Increasing Processor Performance Through Early Register Release", IEEE International Conference on Computer Design: VLSI in Computers and Processors, Oct. 11-13, 2004, 8 pages.

U.S. Appl. No. 16/668,469, filed Oct. 30, 2019, listing Michael ESTLICK et al. as inventor(s), entitled "Shadow Latches in a Shadow-Latch Configured Register File for Thread Storage", 29 pages.

U.S. Appl. No. 16/585,817, filed Sep. 27, 2019, listing Arun A. Nair et al. as inventors, entitled "Bit Width Reconfiguration Using a Shadow-Latch Configured Register File", 24 pages.

International Search Report and Written Opinion issued in Application No. PCT/US2021/032992, 12 Pages.

Final Office Action dated Aug. 30, 2021 in U.S. Appl. No. 16/585,817, 24 pages.

Final Office Action dated Nov. 23, 2021 for U.S. Appl. No. 16/668,469, 27 pages.

Office Action dated Jul. 6, 2021 in U.S. Appl. No. 16/668,469, 31 pages.

Notice of Allowance issued in U.S. Appl. No. 16/585,817, dated Aug. 25, 2022, 7 pages.

Non-Final Office Action issued in U.S. Appl. No. 16/668,469 dated Jun. 28, 2022, 31 Pages.

International Preliminary Report on Patentability dated May 12, 2022 for PCT/US2020/057945, 7 pages.

International Preliminary Report on Patentability dated Apr. 7, 2022 for Application No. PCT/US2020/052756, 9 Pages.

Non-Final Office Action dated Apr. 4, 2022 for U.S. Appl. No. 16/585,817, 27 pages.

Hardell, WR et al., "Shadow Latches for Synchronized Reading of Error Registers", 1990, pp. 454-455.

* cited by examiner

US 11,599,359 B2

METHODS AND SYSTEMS FOR UTILIZING A MASTER-SHADOW PHYSICAL REGISTER FILE BASED ON VERIFIED ACTIVATION

BACKGROUND

A processor typically utilizes a physical register file (PRF) to store data for use by functional units of the processor. A PRF can support both Out-of-Order (OoO) instruction execution and speculative execution of instructions across an instruction window. A large instruction window allows for high performance of the processor but also necessitates a sizable PRF. Further, as the number of execution units supported by the processor increases, additional reads and writes need to be supported by the PRF, requiring both additional registers and additional ports for each register. These additional registers and ports make the PRF a significant physical design bottleneck to enabling large instruction windows with wide execution widths. Previous solutions proposed to accommodate the wide execution widths include duplication of the PRF to reduce the number of read ports per PRF and hierarchical PRF schemes that involve a hierarchy of PRFs with complex mechanisms to track and move entries between the PRFs.

The average lifetime of an active PRF entry also affects its reusability and hence the effective size of the PRF. With OOO and speculative execution, a significant portion of the active lifespan of the PRF is spent waiting in recovery mode, where the PRF is not actively read and lies in wait in case of a wrongly predicted speculative execution. Improvements in handling the active lifespan of the PRF effectively boosts reusability and provides some relief for enlarged PRFs.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
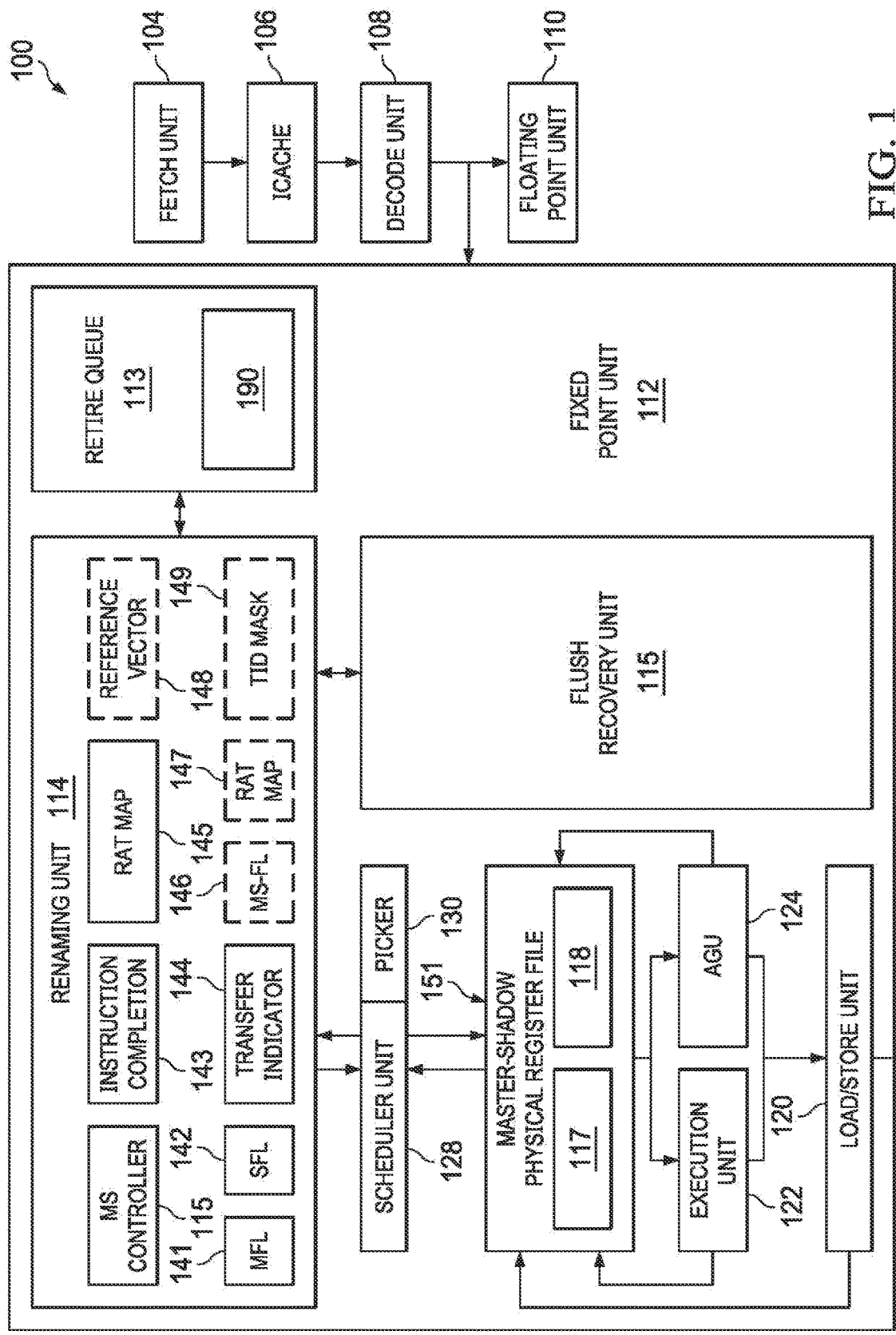
FIG. 1 is a block diagram of a processor in accordance with some embodiments.

FIGS. 1-5 illustrate embodiments for implementing data storage in a master-shadow physical register file. The master-shadow physical register file includes master-shadow physical registers that include both master storage elements ("master storage") and shadow storage elements ("shadow storage"). Master storage is storage that is configured to store active data, e.g., data currently being used in the execution of instructions. Shadow storage is storage coupled to the master storage that stores dormant data, e.g., data not currently being executed. In order to facilitate storage of data in the master-shadow physical register file, data is initially stored in master storage and, based upon the occurrence of shadow transfer activation conditions or a plurality of shadow transfer activation events (shadow activation events), is subsequently transferred to shadow storage in the master-shadow physical register. By using the combination of master storage and shadow storage to store data, the processor has a larger physical register file profile and more effective entries compared to traditional PRFs without increasing the size of the read or write multiplexers.

Register renaming is a technique that, after an instruction has been decoded, maps architectural registers to physical registers in the processor. In some embodiments, architectural registers are represented using architectural register numbers (ARNs) and physical registers are represented using physical register numbers (PRNs). In some embodiments, in order to store data the in master-shadow physical registers that have been renamed during the register renaming process, a master-shadow controller determines whether shadow transfer activation conditions or a plurality of shadow transfer activation events (shadow activation events) have occurred. In some embodiments, a shadow activation event includes determining that a first instruction being executed by the processor has completed (i.e., the first instruction has written the result of the operation to the master-shadow physical register associated with a first physical register number (PRN)). In some embodiments, a shadow activation event includes a determination that a resultant ARN (i.e., a resultant ARN associated with the instruction that is used during the renaming process) of the first instruction being renamed by the renaming unit of the processor is equivalent to a resultant ARN of a second instruction being renamed by the renaming unit of the processor. In some embodiments, a shadow activation event includes determining that shadow storage associated with the master storage is available for data storage. In another embodiment, a shadow activation event includes a determination by, for example, the retire queue of the processor, that a first instruction that is utilizing master storage of the master-shadow physical register file has retired. Thus, in some embodiments, in order to transfer data from the master storage to the shadow storage, the master-shadow controller determines whether the first shadow activation event and the second shadow activation event occurred. In some embodiments, in order to transfer data from the master storage to the shadow storage, the master-shadow controller determines whether the shadow transfer activation conditions have occurred. When the master-shadow controller determines that the shadow activation conditions have occurred, the shadow storage associated with master storage is available, and data is transferred from master storage to shadow storage.

FIG. 1 illustrates a processor 100 that utilizes a master-shadow physical register file 151 to store data in accordance with some embodiments. The illustrated processor 100 can include, for example, a central processing unit (CPU) core based on an x86 instruction set architecture (ISA), an ARM ISA, and the like. In some embodiments the processor 100 implements a plurality of such processor cores, and in different embodiments the processor is implemented in any of a variety of electronic devices, such as a notebook computer, desktop computer, tablet computer, server, computing-enabled cellular phone, personal digital assistant (PDA), set-top box, and the like.

In the depicted example, the processor 100 includes an instruction cache 106, a fetch unit 104, a decode unit 108, one or more floating-point units 110, and one or more fixed-point units 112 (also commonly referred to as "integer execution units"). In some embodiments, the fetch unit 104 is coupled to the instruction cache 106. The instruction cache 106 is coupled to the decode unit 108. The decode unit 108 is coupled to the floating-point unit 110 and the fixed-point unit 112.

The instruction cache 106 stores instruction data which is fetched by the fetch unit 104 in response to demand fetch operations (e.g., a fetch to request the next instruction in an instruction stream identified by a program counter) or in response to speculative prefetch operations. The decode unit 108 decodes instructions fetched by the fetch unit 104 into one or more operations that are to be performed, or executed, by either the floating-point unit 110 or the fixed-point unit 112. In a microcoded processor architecture, this decoding includes translating the instruction into one or more micro-operations (uOps), whereby each uOp is identified by a corresponding opcode value and can be separately executed within the fixed-point unit 112. Those operations involving floating-point calculations are dispatched to the floating-point unit 110 for execution, whereas operations involving fixed-point calculations are dispatched to the fixed-point unit 112.

The fixed-point unit 112 includes a renaming unit 114, a scheduler unit 128, a picker unit 130, a master-shadow physical register file (MS-PRF 150), a load/store unit (LSU) 120, and one or more execution (EX) units 122, such as one or more arithmetic logic units (ALUs), and one or more address generation (AG) units 124. The renaming unit 114 is coupled to the scheduler unit 128, the picker unit 130, and the retire queue 113. The scheduler unit 128 and picker unit 130 are coupled to the MS-PRF 151. The MS-PRF 151 is coupled to the execution unit 122 and the address generation unit 124. The execution unit 122 and the address generation unit 124 are coupled to the LSU 120. The LSU 120 is coupled to a memory hierarchy, including one or more levels of cache (e.g., L1 cache, L2, cache, etc.), a system memory, such as system RAM, and one or more mass storage devices, such as a solid-state drive (SSD) or an optical drive.

The MS-PRF 151 includes master-shadow physical registers (depicted as MSPRs 230 in FIG. 2) that utilize master storage 117 and shadow storage 118 for storage of data. In some embodiments, static random-access memory (SRAM) with multiple read and write ports is used to implement MS-PRF 151. Unlike PRFs used in conventional processors, MS-PRF 151 includes both master storage 117 and shadow storage 118. Master storage 117 is storage that is configured to store active data, i.e., data currently being used in the execution of instructions. Shadow storage 118 is storage coupled to the master storage that stores dormant data, i.e., data not currently being executed. Data is stored in the master-shadow physical register file 150 when, for example, the data is operated on as part of a data processing operation.

The renaming unit 114 includes a master-shadow controller 115, a master free list 141, a shadow free list 142, an PRN completion vector or vector 143, a transfer indicator 144, and a register alias table (RAT) map 145 (also known as a speculative map). In some embodiments, instead of RAT map 145, renaming unit 114 includes RAT map 147, a master-shadow free list 146, reference vector 148, and thread identifier (TID) mask 149. In some embodiments, reference vector 148 is a data structure that is used by master-shadow controller 115 to determine whether a PRN is available for renaming. In some embodiments, the completion vector 143 is not required when reference vector 148 is utilized. In some embodiments, reference vector 148 is equivalent to the completion vector 143 but also includes an additional condition of checking for references in scheduler unit 128. Master-shadow controller 115 is used to manage register renaming for the master-shadow physical register file 151. The master free list 141 is a data structure used to indicate which master storage elements in master storage 117 are available for register renaming. The shadow free list 142 is a data structure used to indicate which shadow storage elements in shadow storage 118 are available for transfer from, for example, master storage 117. PRN completion vector 143 is a data structure used to indicate which instructions have completed in fixed-point unit 11. Transfer indicator 144 is a data structure used to indicate whether data has been transferred from master storage 117 to shadow storage 118. In some embodiments, a bit that is utilized in transfer indicator 144 to indicate whether the data has been transferred from master storage 117 to shadow storage 118 is referred to as, for example, a color bit (represented as, for example, either color bit BLACK or color bit RED). RAT map 145 is a data structure that maps architectural register numbers (ARNs) to physical register numbers (PRNs) during the register renaming process. RAT map 147 is an alternative form of data structure that maps architectural register numbers (ARNs) to physical register numbers (PRNs) during the register renaming process. As stated previously, reference vector 148 is a data structure that is used by master-shadow controller 115 to determine whether a PRN is available for renaming. In some embodiments, the TID mask 149 is a data structure or vector that includes one bit per PRN for, for example, a two-way Simultaneous Multi-threading (SMT) machine, indicating whether the master storage 117 is associated with or belongs to a specific thread (e.g., thread 0 or thread 1).

In an operation of the fixed-point unit 112, the renaming unit 114 receives operations from the decode unit 108 (usually in the form of operation codes, or opcodes). These dispatched operations typically also include, or reference, associated information used in the performance of the represented operation, such as a memory address at which operand data is stored, architectural registers at which operand data is stored, one or more constant values (also called "immediate values"), and the like.

The renaming unit 114 and the scheduler unit 128 control the selective distribution of operations among the EX units 122 and AG units 124, whereby operations to be performed are queued in the scheduler unit 128 and then picked therefrom by picker 130 for issue to a corresponding EX unit or AG unit.

Typically, each queue entry of the scheduler unit 128 includes a field to store the operation payload or operation identifier (e.g., the opcode for the operation), fields for the addresses or other identifiers of master-shadow physical registers that contain the source operand(s) for the operation, fields to store any immediate or displacement values to be used the operation, and a destination or resultant field that identifies the master-shadow physical register in which the result of the execution of the corresponding operation is to be stored.

The picker 130 monitors the scheduler unit 128 to identify operations ready for execution, and upon picking an available operation and verifying its operands are ready and available, dispatches the operation to an EX unit or an AG unit.

Operations requiring retrieval or storage of data, such as load, store, or load/store operations, are dispatched by the picker 130 to an address generation unit 124, which calculates the memory address associated with the operation and directs the LSU 120 to perform the corresponding memory access using the generated address. For example, for load operations, the calculated memory address is provided to a load queue (not shown) at the LSU 120. The LSU 120 retrieves the memory address from the load queue and retrieves the data stored at the memory address from the memory hierarchy. Operations requiring numerical manipulations or other arithmetic calculations are dispatched to the appropriate execution unit 122 for execution.

The address generation operations performed by the AG units 124 and the arithmetic operations performed by the EX units 122 typically utilize operand data, in the form of one or both of operands stored in source registers or immediate/displacement values. The immediate/displacement value used during execution operation is dispatched to the EX/AG unit along with the operation from the scheduler unit 128. The source operands stored in the master storage 117 of the master-shadow physical registers are read from the MS-PRF 151 and provided to the corresponding EX/AG unit for use in executing the operation. Typically, these source operands are obtained by initiating a MS-PRF read to the MS-PRF 151. In some embodiments, the operand is typically not expected to source from, for example, the shadow copy directly.

Load operations performed by the AG unit 124/LSU 120 and arithmetic operations performed by the EX unit 122 result in data that is to be stored in the master-shadow physical register identified as the destination of the load operation or arithmetic operation. Accordingly, each of the EX unit 122 and the LSU 120, upon generating a result (either by completing an arithmetic operation for the EX unit 122 or by loading data from the memory hierarchy for the LSU 120), initiates a MS-PRF write to the destination of the load instruction, which in the embodiments exemplified using FIG. 1, is master storage 117.

The fixed-point unit 112 includes retire queue 113 that stores instructions that are waiting to retire or are in the process of being retired. A master free list 141 and a shadow free list 142 include entries associated with the master-shadow physical registers in the master-shadow physical register file 151. As stated previously, entries in the master free list 141 and the shadow free list 142 indicate whether the master storage element and/or shadow storage element of the corresponding master-shadow physical register in the master-shadow physical register file 151 is "free" or "available" for register renaming, so that the master storage 117 or the shadow storage 118 of a master-shadow physical register can, for example, be allocated to a decoded instruction, used for storage, or other in-flight operation.

In some embodiments, each entry in shadow free list 142 is associated with an entry in the master free list 141. In some embodiments, the master-shadow physical register file 151 includes 72 master-shadow physical registers, and therefore, the master free list 141 and shadow free list 142 may include up to 72 entries corresponding to the master-shadow physical registers. That is, in some embodiments, the size master free list 141 is equal to the number of master-shadow elements in the master-shadow physical register file 151 and indicates whether master storage in master-shadow physical register file 151 is available for storage. In some embodiments, the size of the shadow free list 142 is equal to the number of master-shadow elements in the master-shadow physical register 151 and indicates whether the shadow storage in the master-shadow physical register file 151 is available for storage.

The retire queue 113 is configured to utilize a retire map 190 to signal to master free list 141 and shadow free list 142 when an instruction has retired so that the master-shadow physical registers currently mapped as the destination architectural register referenced by the retired instruction can be freed for allocation to other instructions or operations, since the retired instruction maps a new master-shadow physical register to that architectural register.

Prior to storing an operation in the scheduler unit 128, the renaming unit 114 performs register renaming whereby external operand names (that is, architected register names (ARNs)) are translated into internal operand names (that is, physical register names (PRNs)). This renaming process includes, for example, the renaming unit 114 evaluating a subset of operations including the operation to be queued to identify any dependencies between sources and destinations associated with the operations, and then mapping architected registers to master-shadow physical registers in master-shadow physical register file 151 so as to avoid false dependencies and facilitate parallel execution of independent operations.

In operation, in some embodiments, a first instruction fetched using fetch unit 104 is decoded and dispatched from decode unit 108 and received at renaming unit 114. The renaming unit 114 receives operations for the decoded first instruction from the decode unit 108. The dispatched operations include source ARNs which represent the architectural representation of the location at which source operand data is stored and a destination or resultant ARNs that identify the ARN at which the result of the execution of the corresponding operation is to be stored. The renaming unit 114 commences the renaming process by determining which PRNs and associated master-shadow physical registers in the master list free list 141 are available for renaming the source ARNs and the destination ARNs. Thus, in some embodiments, the first instruction is associated with a first source ARN (first ARN) representative of the architectural location of a first operand, a second source ARN (second ARN) representative of the architectural location of a second operand, and a third resultant ARN (third ARN) representative of the location at which the result of the execution of the corresponding operation is to be stored. In some embodiments, the first instruction may be associated with more or fewer source ARNs depending on the operation being performed to generate the resultant ARN.

Master-shadow controller 115 of renaming unit 114 determines which PRNs in the master free list 141 are available for renaming by assessing whether a bit associated with a PRN in the master free list 141 is asserted or de-asserted. When, for example, a bit associated with a PRN in the master free list 141 is asserted, the PRN is available for storage and used in the renaming process. When a PRN in the master free list 141 is de-asserted, the PRN is currently not available for use in the renaming process.

In some embodiments, for the first instruction received by renaming unit 114, a first PRN associated with the first source ARN (first ARN) is read from RAT map 145, a second PRN associated with the second source ARN (second ARN) is read from RAT map 145. That is, the PRNs for the source ARNs (first source ARN and second source ARN) are read from RAT map 145. In some embodiments, when master-shadow controller 115 determines that a third PRN in the master free list 141 is available for renaming, the third resultant ARN (third ARN) is renamed to the third PRN. Stated another way, in some embodiments, the PRN for the resultant or destination ARN (third ARN) is the only PRN that is popped from master free list 141. Having popped the master free list 141, the PRN mapping is written into RAT map 145 such that subsequent instructions referencing the third ARN are read utilizing the mapped PRN. Thus, transactions that reference the architectural registers (e.g., the first ARN, the second ARN, and the third ARN) use the mapping performed by renaming unit 114 to process, e.g., write to or read, from the master storage 117 corresponding master-shadow physical registers in the master-shadow physical register file 151 indicated by the physical register numbers (e.g., the first PRN, the second PRN, and the third PRN).

In some embodiments, after or while the fixed-point unit 112 processes the first instruction and data corresponding to the first instruction has been written to master storage 117, a second instruction is fetched by fetch unit 106 and is decoded and dispatched by decode unit 108. Like the first instruction, in some embodiments, the second instruction is associated with a first source ARN, a second source ARN, and a third resultant ARN. The renaming unit 114 receives the decoded second instruction and commences the renaming process by determining which PRNs and associated master-shadow physical registers in the master list free list 141 are available for renaming. Similar to the renaming process for the first instruction, renaming unit 114 reads the PRNs for the source ARNs from RAT map 145 and master-shadow controller 115 determines which PRNs in the master free list 141 are available for renaming by assessing whether a bit associated with a PRN in the master free list 141 is asserted or de-asserted. In addition, master-shadow controller 115 determines whether data stored in master storage 117 from execution of a previous instruction, such as, for example, the first instruction, is transferrable to shadow storage 118.

In one embodiment, in order to determine whether data stored in master storage 117 is transferrable to shadow storage 118, master-shadow controller 115 determines whether shadow activation conditions have occurred or been satisfied. In some embodiments, there are three shadow activation events that occur in order to transfer data stored in master storage 117 to shadow storage 118. In some embodiments, the shadow activation events include determining whether the shadow storage 117 is available for storage, whether the previous instruction has completed (i.e., whether the previous instruction has written the result of the operation to the master-shadow physical register associated with the PRN), and whether the resultant ARN of the second instruction is equivalent to the resultant ARN of the first instruction (i.e., whether the destination ARN of the subsequent instruction is equivalent to the destination ARN of the current instruction). Thus, in some embodiments, when master-shadow controller 115 determines that the first shadow activation event, the second shadow activation event, and the third activation event have occurred, data is transferred from the master storage 117 to shadow storage 118.

As stated previously, master-shadow controller 115 determines whether the shadow storage 117 associated with the master storage 118 is free by assessing a logical value in shadow free list 142 is asserted (not available) or de-asserted (available). Master-shadow controller 115 determines whether the first instruction has completed by assessing a logical value in an PRN completion vector 143 associated with the PRN that, when asserted, indicates that the operation writing to the master storage 117 associated with the PRN has completed and been written to the master-shadow physical register file 151.

When master-shadow controller 115 determines that the previous instruction (in this case, the first instruction) has completed (i.e., the previous instruction has written the result of the operation to the physical register associated with the PRN), the resultant ARN of the second instruction is equivalent to the resultant ARN of the first instruction, and the shadow storage 117 is available for storage, master-shadow controller 115 signals to the master-shadow physical register 151 to transfer the data from master storage 117 to the associated shadow storage 118. In some embodiments, the PRN space and the ARN space are orthogonal, i.e., the second instruction that writes the same ARN as the first does not need to attain the same PRN as the first. Master-shadow physical register 151 transfers the data from master storage to the associated shadow storage.

In another embodiment, in order to determine whether data stored in master storage 117 is transferrable to shadow storage 118, master-shadow controller 115 determines whether an additional shadow activation event has occurred. That is, master-shadow controller 115 determines whether the first instruction utilizing master storage 117 has retired. When master-shadow controller 115 determines that the first instruction has retired, master-shadow controller 115 signals to the master-shadow physical register 151 to transfer the data from master storage 117 to the associated shadow storage 118. Master-shadow physical register 151 transfers the data from master storage 117 to the associated shadow storage 118.

After the data is transferred from master storage 117 to the associated shadow storage 118, master-shadow controller 115 updates the master free list 141 to indicate that the master storage 117 whose data has been transferred to the shadow storage 118 is now available for renaming and storage purposes. In addition, master-shadow controller 115 updates the shadow free list 142 to indicate that the shadow storage 118 that now contains data has been transferred from the master storage 117 is no longer available.

In some embodiments, in order to transfer data from the shadow storage 118 to master storage 117, master-shadow controller 115 determines whether a shadow-to-master transfer event has occurred. That is, master-shadow controller 115 determines whether the master storage 117 associated with the shadow storage 118 has been flushed or there is a misprediction. When master-shadow controller 115 determines that the master storage 117 has not been flushed, the data stored in master storage 117 remains in master storage 117 until the data is read or the data becomes dormant. When master-shadow controller 115 determines that the master storage 117 has been flushed, data from shadow storage 118 is transferred to the master storage 117 associated with the shadow storage 118. The data that has been temporarily stored in the shadow storage 118 and transferred back to master storage 117, is now available for read or restore operations.

Figure 2:
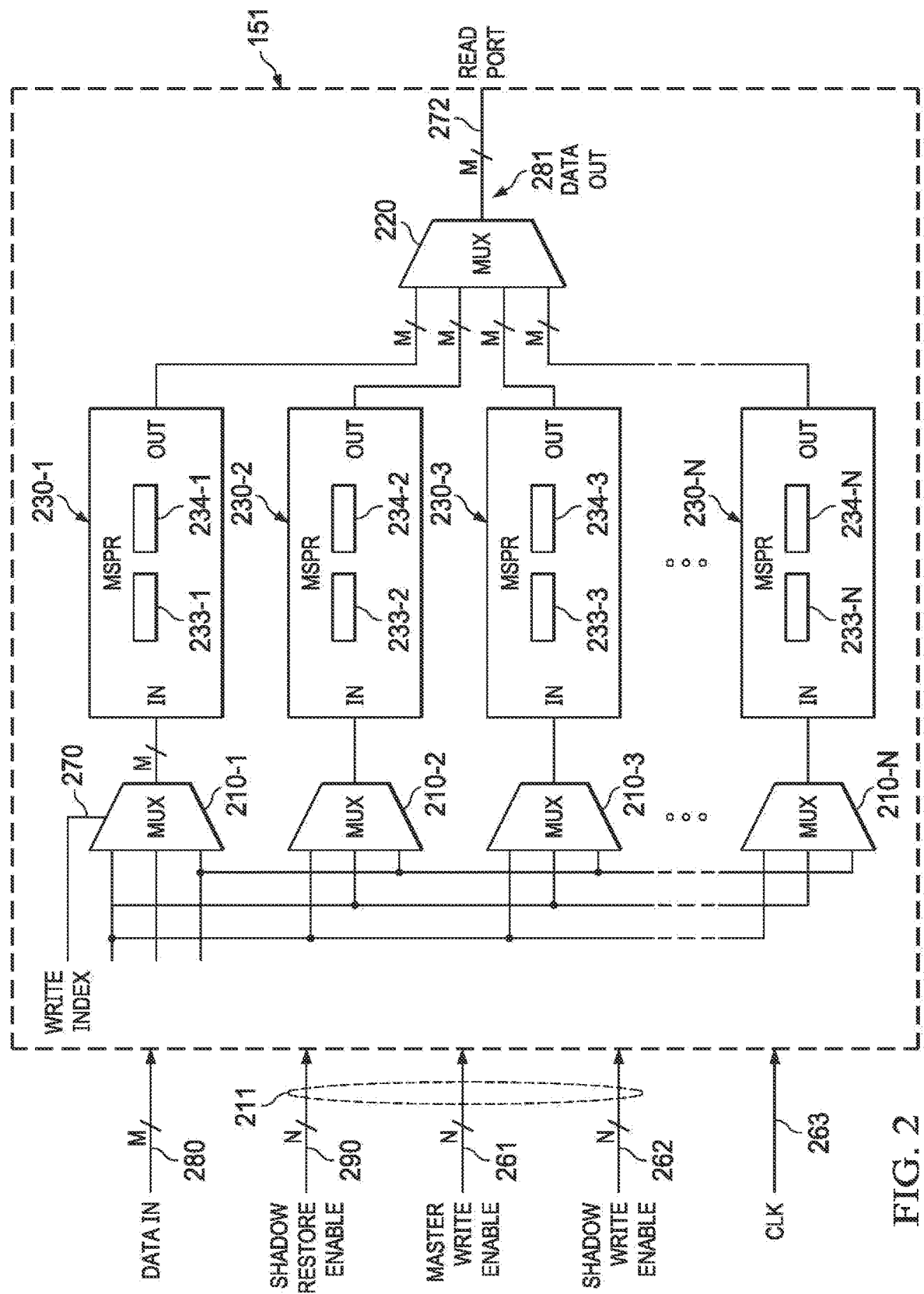
FIG. 2 is a block diagram of a master-shadow physical register file of the processor of FIG. 1 in accordance with some embodiments.

FIG. 2 illustrates master-shadow physical register file 151 of the processor of FIG. 1 in accordance with some embodiments. The master-shadow physical register file (MS-PRF) 151 includes write multiplexers (MUX) 210-1-210-N, master-shadow physical registers (MSPRs) 230-1-230-N, and read multiplexer (MUX) 220. In one embodiment of the example provided in FIG. 2, the output of write MUX 210-1 is coupled to input of MSPR 230-1, the output of write MUX 210-2 is coupled to input of MSPR 230-2, and the output of write MUX 210-3 is coupled to input of MSPR 230-3. Further, the output of MSPR 230-1 is coupled to the input of read MUX 220, the output of MSPR 230-2 is coupled to the input of read MUX 220, and the output of MSPR 230-3 is coupled to the input of read MUX 220.

Each MSPR 230 includes a plurality of master-shadow elements (MSE), described in detail below with reference to FIG. 2. In some embodiments, for example, for an N bit MSPR 230, there are N MSEs included in each MSPR 230. The MS-PRF 151 includes a plurality of MSPRs M, where M is the number of bits to be stored in the MSPR.

For a write operation, in addition to receiving clock signal 263 and control signals 211, which include shadow restore enable signals 290, master write enable signal 261, shadow write enable signals 262, MS-PRF 151 receives a PRN using write index 270 at MUX 210 indicative of the MSPR 230 the physical register where input data 280 is to be stored. The shadow restore enable signal 290 is a signal that indicates whether shadow data stored in the shadow storage of MSPR 230 is to be transferred to the master storage of MSPR 230 (described in further detail in FIG. 3). Master write enable signal 261 is a signal used to enable or disable the master writing capabilities of the MS-PRF 151 (i.e., enabling master storage in the corresponding MSPR 230). Shadow write enable signal 262 is used to enable or disable the shadow writing capabilities of the MS-PRF 151. That is, shadow write enable 261 enables the shadow storage capabilities of the corresponding MSPR 230. The clock signal 263 is a traditional clock signal used to trigger read and write operations, except that, in some embodiments, it is used in conjunction with master write enable signal 261 and shadow write enable signal 262 to enable or disable the master storage writing and shadow storage writing capabilities, as described with reference to FIG. 3 below.

MS-PRF file 151 receives the PRN at write index 270 and uses MUX 210 to select the corresponding MSPR 230 to store input data 280. In some embodiments, input data 280 and the control signals 299 are provided to the MSPR 230 that has been selected by MUX 210. The selected MSPR 230 receives master write enable signal 261 and the clock signal 263 of the control signals 299 and when both signals are at a logically high level, the master storage elements 233 (e.g., storage elements including but not limited to a plurality master flip-flops depicted in FIG. 3) of the selected MSPR 230 are enabled, and the input data 280 is written to the master storage elements of the MSPR 230.

In addition to the clock signal 263, the selected MSPR 230 also receives the shadow write enable signal 262, which, when asserted, is used to indicate that data stored in the master storage elements 233 of MSPR 230 is dormant and should be transferred to the shadow storage elements 234 of MSPR 230. When the shadow write enable signal 262 and the clock signal 263 are at a logically high value, the data that is in the master storage elements 233 of MSPR 230 is stored in the shadow storage elements 234 of MSPR 230. After the data stored in the master storage elements 233 are transferred to the shadow storage elements 234, the master storage elements 233 of the MSPR 230 are available for storage of additional input data 280.

In some embodiments, when the shadow storage data stored in the shadow storage elements 234 is required for restore or subsequent read operations, the shadow storage data is recalled indirectly from shadow storage elements 234 using shadow restore enable signal 290. That is, the shadow restore enable signal 290 is asserted and the data stored in the shadow storage elements 234 of the selected MSPR 230 is transferred to master storage elements 233. The data stored in master storage elements 233 of the selected MSPR 230 is available via MUX 220 and provided to the read port 272 as read output data 281.

In some embodiments, when the shadow storage data stored in the shadow storage elements 234 is required for read operations, the shadow storage data is recalled directly from shadow storage elements 234 using shadow restore enable signal 290. That is, the shadow restore enable signal 290 is asserted and the data stored in the shadow storage elements 234 of the selected MSPR 230 is provided directly via MUX 220 to the read port 272 as read output data 281, in addition to or instead of being provided directly to master storage elements 233. In some embodiments, providing the data stored in the shadow storage elements 234 to the read port 272 as read output data 281 is only possible when the master or shadow read mux has, for example, a local select line. In some embodiments, the MSPR 230 is configured to provide the local select line information as an additional bit (M+1).

Figure 3:
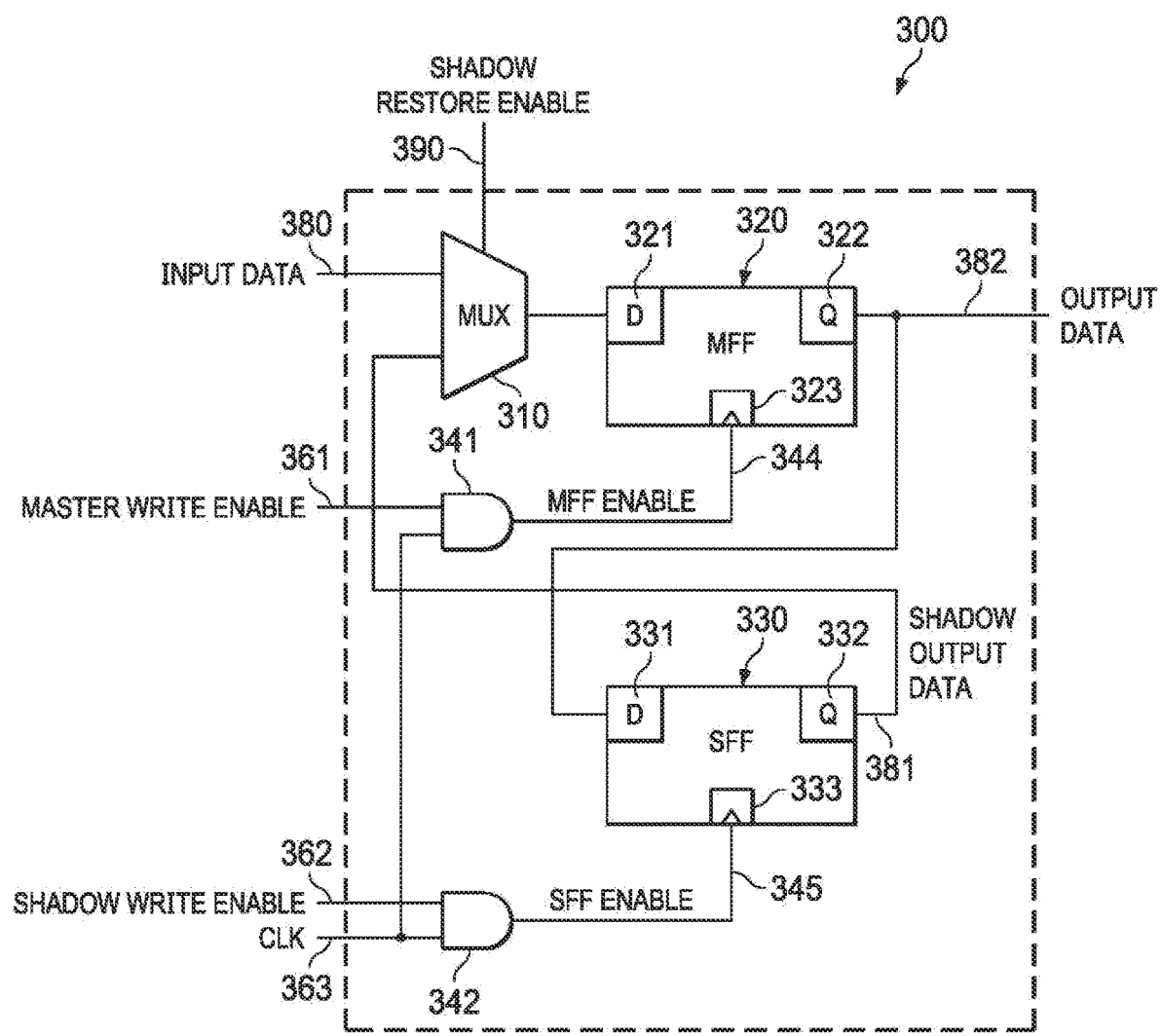
FIG. 3 is a block diagram of a master-shadow element of the master-shadow physical register file of the processor of FIG. 1 in accordance with some embodiments.

FIG. 3 illustrates a master-shadow element 300 utilized in the master-shadow physical register file 151 of FIGS. 1 and 2 in accordance with some embodiments. The data stored in shadow storage of master-shadow element 300 is accessed indirectly during a read or restore operation via master storage. Although only a single master-shadow element (MSE) 300 is depicted in FIG. 3, use of a plurality of master-shadow elements 300 allow for the storage of a plurality of data in the master-shadow physical registers 230 depicted in FIG. 2, where each master-shadow physical register 230 has an M bit number of MSEs. The master-shadow element 300 includes a write multiplexer (MUX) 310, an AND gate 341, an AND gate 342, a master flip-flop 320, and a shadow flip-flop 330. Write MUX 310 is used by master-shadow element 300 to select which data, either input data 380 or shadow output data 381, is provided to MFF 320. AND gate 341 is used by master-shadow element 300 to generate an MFF enable signal 344 that, based upon the logical value of a master write enable signal (master write enable) 361 and clock signal 363, enables or disables MFF 320 for data storage. AND gate 342 is used by master-shadow element 300 to generate an SFF enable signal (SFF enable) 345 that, based upon the logical value of a shadow write enable signal 362 and clock signal 363, enables or disables SFF 330 for data storage. MFF 320 is used by master-shadow element 300 to store, based on shadow restore enable signal (shadow restore enable) 390, input data 380 or shadow output data 381. SFF 330 is used by master-shadow element 300 to store, based on the logical value of shadow write enable signal 362 and clock 363, output data 382 provided from MFF 320.

The master flip-flop 320 includes a write input 321 for receiving a data value to be stored in the master flip-flop 320, a read output 322 for providing either a regular data value or shadow data value provided from SFF 330 that is currently stored in the master flip-flop 320, and a write enable input 323 which is responsive to MFF enable signal 344 output by AND gate 341. The shadow flip-flop 330 includes a write input 331 for receiving a data value (e.g., output data 382) to be stored in the shadow flip-flop 320, a read output 332 for providing a shadow output data value (e.g., provided from SFF 330 that is currently stored in the shadow flip-flop 330, and a write enable input 333 which is responsive to SFF enable signal 345 output by AND gate 342. Output data 382 is data output from MFF 320 that is read and provided as input data for storage in SFF 330 when SFF 330 has been enabled for shadow storage.

In operation, in order to write data to MFF 320, master write enable signal 361 is set to a logically high value and, as a result, when clock signal 363 transitions from a logically low value to a logically high value, MFF enable signal 344 is asserted and MFF 320 is enabled for storage. That is, MFF 320 can either write input data 380 to MFF 320 or shadow output data 381 to MFF 320 depending on whether shadow restore enable 390 is asserted or de-asserted.

For example, when shadow restore enable 390 is de-asserted (e.g., a low logic level) and MFF enable signal 344 is at a logically high level (i.e., master write enable signal 361 is logically high and clock 363 is logically high), MFF 320 is enabled and input data 380 is selected by write MUX 310 to be stored in MFF 320. As a result, input data 380 that was stored in MFF 320 is available to be read or provided at input to SFF 330 at read output 322. Alternatively, when shadow restore enable 390 is asserted and MFF enable signal 344 is at a logically high level, shadow output data 381 is selected at write MUX 310 and stored in MFF 320. As a result, the data that was previously stored in SFF 330 is available to be read at read output 322.

As stated previously, master-shadow element 300 is also capable of writing output data 382 to SFF 330. In order to write output data 382 to SFF 330, shadow write enable 362 is set to a logic high level, and as a result, when clock 363 transitions to a high logic level, SFF enable signal 345 (i.e., the output of AND gate 342) is asserted and SFF 330 is enabled for storage and output data 382 is written to SFF 330. The output data 382 stored in SFF 330 is available for restore operations or to be read upon assertion of the shadow restore enable signal 390 at MUX 310.

During a read operation, when a read request is made for data that is stored in MFF 320, data stored in MFF 320 is provided at the output of MFF 320 as output data 382. In some embodiments, output data 382 is either data that has not been previously stored in SFF 330, i.e., input data 380 output directly by MUX 310, or data that has been previously stored in SFF 330, i.e., shadow output data 381. For example, in some embodiments, when a restore operation or a read request is made for the shadow data that is stored in SFF 330, shadow restore enable 390 is asserted at write MUX 310 and, instead of the input data 380 being selected as the data to be provided at the output of write MUX 310, shadow output data 381 stored in the SFF 330 is provided to MUX 310 and written to MFF 320. The shadow output data 381 is now available to be read from MFF 320 at read output 322 as output data 382.

Figure 4:
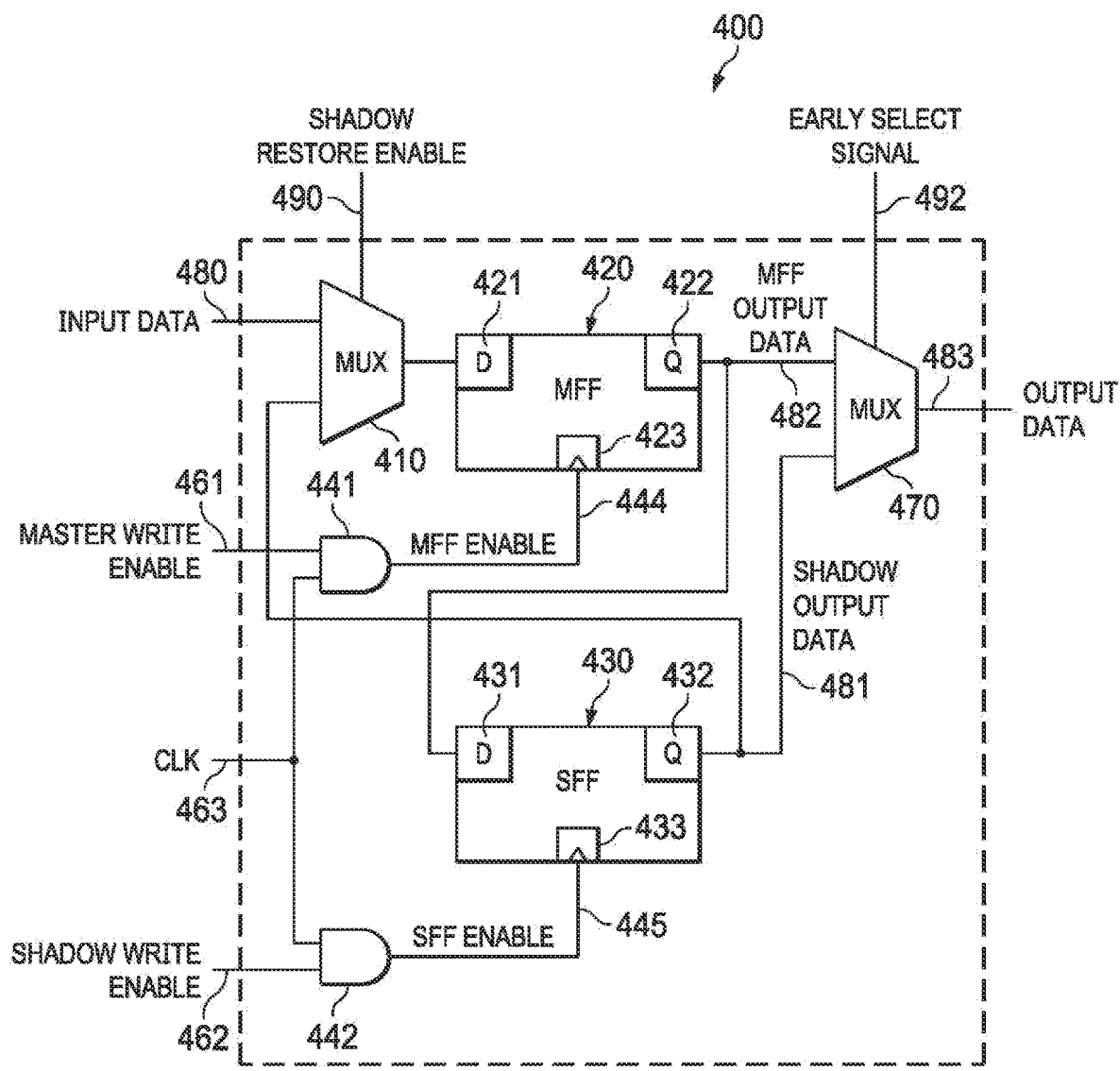
FIG. 4 is a block diagram of a master-shadow element of the master-shadow physical register file of the processor of FIG. 1 in accordance with some embodiments.

FIG. 4 illustrates a master-shadow element 400 utilized in the master-shadow physical register file 151 of FIG. 1 in accordance with some embodiments. The data stored in shadow storage of master-shadow element 300 is accessed directly from shadow storage during a read or restore operation. Although only a single master-shadow element (MSE) 400 is depicted in FIG. 4, use of a plurality of master-shadow elements 400 allow for the storage of a plurality of data in the master-shadow physical registers 230 depicted in FIG. 2, where each master-shadow physical register 230 has an M bit number of MSEs. The master-shadow element 400 includes a write multiplexer (MUX) 410, an AND gate 441, an AND-gate 442, a master flip-flop (MFF) 420, a shadow flip-flop (SFF) 430, and a MUX 470.

MUX 410 is used by master-shadow element 400 to select which data, either input data 480 or shadow output data 481, is provided to MFF 420. AND gate 441 is used by master-shadow element 400 to generate an MFF enable signal 444 that, based upon the logical value of a master write enable signal (master write enable) 461 and clock signal 463, enables or disables MFF 420 for data storage. For example, when master write enable signal 461 is high and clock signal 463 is high, MFF enable signal 444 is asserted and MFF 420 is enabled to be written to. However, when either master write enable signal 461 or clock signal 463 is low, MFF enable signal 444 is low and MFF 420 is disabled and cannot be written to.

AND-gate 442 is used by master-shadow element 400 to generate an SFF enable signal (SFF enable) 445 that, based upon the logical value of a shadow write enable signal 462 and clock signal 463, enables or disables SFF 430 for data storage. For example, when shadow write enable signal 462 is high and clock signal 463 is high, SFF enable signal 445 is asserted and SFF 430 is enabled to be written to. However, when either shadow write enable signal 462 or clock signal 463 is low, SFF enable signal 445 is low and SFF 430 is disabled and cannot be written to. MFF 420 is used by master-shadow element 400 to store, based on shadow restore enable signal (shadow restore enable) 490, input data 480 or shadow output data 481. SFF 430 is used by master-shadow element 400 to store, based on the logical value of shadow write enable signal 462 and clock signal 463, MFF output data 2 provided from MFF 420.

Write MUX 470 is used by master-shadow element 400 to select, based on the logical value of an early select signal 492, MFF output data 482 or shadow output data 481, as output to MUX 470. Early select signal 492, in combination with MUX 470, allows shadow output data 481 to be directly readable. As a result, when the early select signal 492 is asserted (logically high), unlike the SFF 330 in master-shadow element 300 of FIG. 3, the SFF 430 of the master-shadow element 400 is directly readable during a read operation. When the early select signal 492 is de-asserted (logically low), MFF output data 482 is selected as the output to MUX 470.

Similar to the master flip-flop 320 in the master-shadow element 300 of FIG. 3, the master flip-flop 420 includes a write input 421 for receiving a data value to be stored in the master flip-flop 420, a read output 422 for providing either a regular data value or shadow data value provided from SFF 430 that is currently stored in the master flip-flop 420, and a write enable input 423 which is responsive to MFF enable signal 444 output by AND gate 441. The shadow flip-flop 430 includes a write input 431 for receiving a data value (e.g., MFF output data 482) to be stored in the shadow flip-flop 430, a read output 432 for providing a shadow output data value (e.g., provided from SFF 430 that is currently stored in the shadow flip-flop 430, and a write enable input 433 which is responsive to SFF enable signal 445 output by AND-gate 442. MFF output data 482 is data output from MFF 420 that is read and provided as input data for storage in SFF 430 when SFF 430 has been enabled for shadow storage.

In operation, in order to write data to MFF 420, master write enable signal 461 is set to a logically high value and, as a result, when clock signal 463 transitions from a logically low value to a logically high value, MFF enable signal 444 is asserted and MFF 420 is enabled for storage. That is, MFF 420 can either write input data 480 to MFF 420 or shadow output data 481 to MFF 420 depending on whether shadow restore enable signal 490 is asserted or de-asserted.

For example, when shadow restore enable signal 490 is de-asserted (e.g., a low logic level) and MFF enable signal 444 is at a logically high level (i.e., master write enable signal 461 is logically high and clock signal 463 is logically high), MFF 420 is enabled and input data 480 is selected by write MUX 410 to be stored in MFF 420. As a result, input data 480 that was stored in MFF 420 is available to be read or provided at input to SFF 430 at read output 422. Alternatively, when shadow restore enable signal 490 is asserted and MFF enable signal 444 is at a logically high level, shadow output data 481 is selected at write MUX 410 and stored in MFF 420. As a result, the data that was previously stored in SFF 430 is available to be read at read output 422.

As stated previously, master-shadow element 400 is also capable of writing MFF output data 482 to SFF 430. In order to write MFF output data 482 to SFF 430, shadow write enable signal 462 is set to a logic high level, and as a result, when clock signal 463 transitions to a high logic level, SFF enable signal 445 (i.e., the output of AND-gate 442) is asserted and SFF 430 is enabled for storage and MFF output data 482 is written to SFF 430. The MFF output data 482 stored in SFF 430 is available to be read upon assertion of the shadow restore enable signal 490 at MUX 410.

In some embodiments, during a read operation, when a read request is made for data that is stored in SFF 430, data stored in SFF 430 is provided at the output of SFF 430 as shadow output data 481. Shadow output data 481 is then provided as output data 483 of MUX 470. In some embodiments, during a read operation, when a read request is made for data that is stored in MFF 420, data stored in MFF 420 is provided at the output of MFF 420 as MFF output data 482. In some embodiments, MFF output data 482 is either data that has not been previously stored in SFF 430, i.e., input data 480 output directly by MUX 410, or data that has been previously stored in SFF 430, i.e., shadow output data 481. For example, in some embodiments, when a read request is made for the shadow data that is stored in SFF 430, shadow restore enable signal 490 is asserted at write MUX 410 and, instead of the input data 480 being selected as the data to be provided at the output of write MUX 410, shadow output data 481 stored in the SFF 430 is provided to MUX 410 and written to MFF 420. The shadow output data 481 is now available to be read from MFF 420 at read output 422 as MFF output data 482, which is provided as output data 483 of MUX 470.

Figure 5:
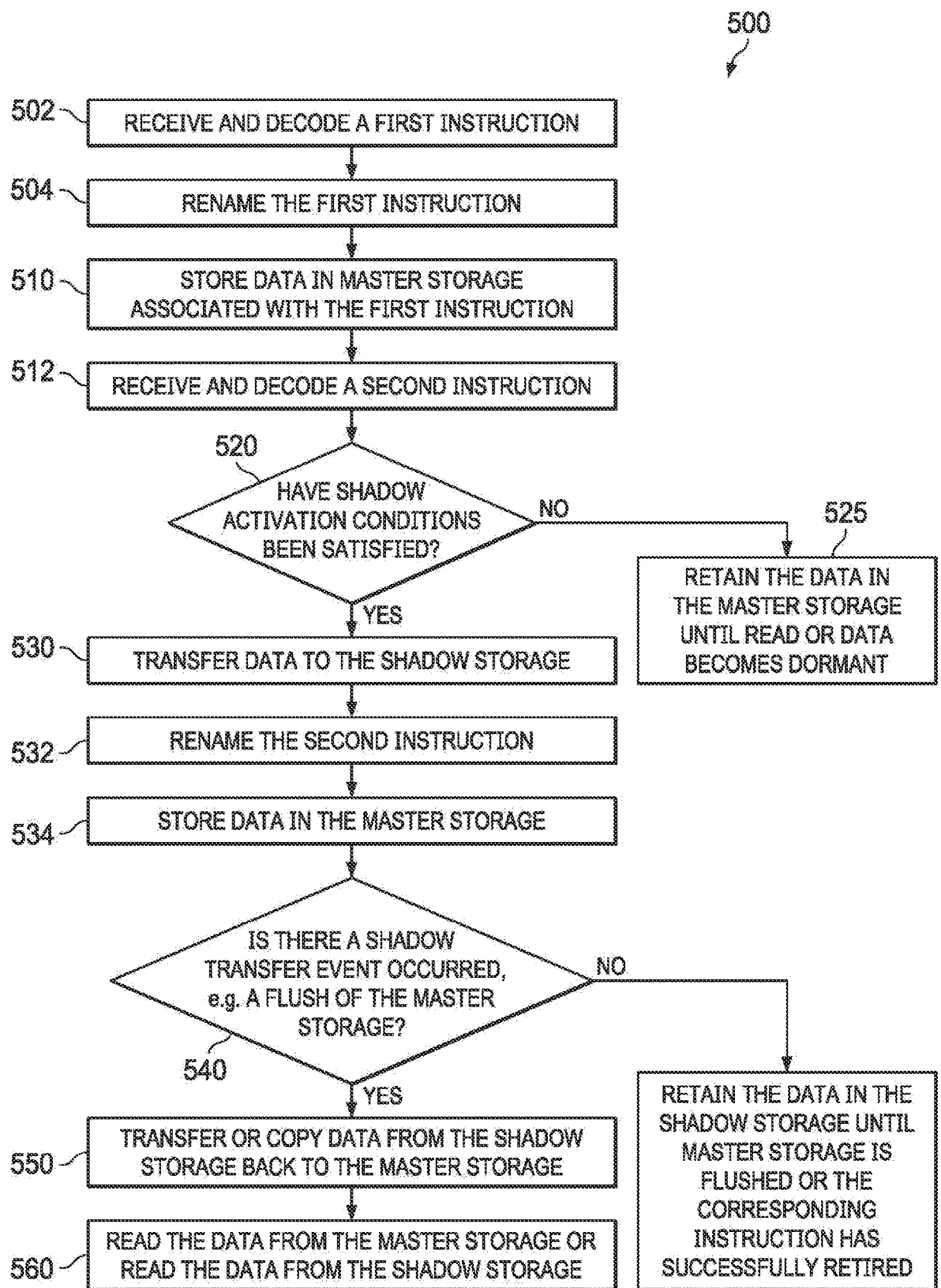
FIG. 5 is a flow diagram illustrating a method for performing storage of data in a master-shadow PRF of the processor of FIG. 1 in accordance with some embodiments.

FIG. 5 is a flow diagram illustrating a method 500 for performing storage of data in a master-shadow PRF of the processing system of FIG. 1 in accordance with some embodiments. The method 500 is described with reference to FIGS. 1 and 2.

Method 500 commences at block 502, where processor 100 receives and decodes a first instruction. At block 504, renaming unit 114 renames the first instruction. At block 510, processor 100 stores data associated with the first instruction in master storage 117 of master-shadow physical register 151. At block 512, processor 100 receives and decodes a second instruction.

At block 520, master-shadow controller 115 determines whether shadow activation conditions have occurred or been satisfied. In some embodiments a first shadow activation event includes, for example, a previous instruction having completed (i.e., the previous instruction has written the result of the operation to the master-shadow physical register associated with a first PRN). In some embodiments, a second shadow activation event includes a determination by master-shadow controller 115 that a third ARN of a second instruction received by renaming unit 114 is equivalent to a third ARN of the first instruction (i.e., whether the destination ARN of the previous instruction received by the renaming unit 114 is equivalent to the destination ARN of the current instruction received by the renaming unit 114). In some embodiments, a third shadow activation event includes a determination that the PRN associated with the data stored in master storage has been retired.

In some embodiments, when a first shadow activation condition has been satisfied, i.e., when both the first shadow activation event and the second shadow activation event have occurred, at block 530, data stored in master storage 117 is transferred to shadow storage 118. In some embodiments, second activation condition has been satisfied, i.e., when the third activation event occurs, data stored in master storage 117 is transferred to shadow storage 118.

At block 520, when master-shadow controller 115 determines that a shadow activation condition has not been satisfied, e.g., a shadow activation event has not occurred the data in master storage 117, at block 525, master-shadow physical register 151 retains the data stored in the master storage 118 until, for example, a shadow activation event has occurred.

At block 530, master-shadow controller 115 determines that shadow activation conditions have been satisfied, data from the master storage 117 is transferred to the shadow storage 118. At block 532, optionally, in some embodiments, the second instruction is renamed, such that the resultant ARN is mapped to the PRN of the newly available master storage 117. At block 532, data is stored in the master storage 117 that was renamed in block 532.

At block 540, when master controller 115 determines that a shadow-to-master transfer event has occurred, at block 550, data is transferred or copied from shadow storage 118 to master storage 117. At block 560, upon receiving a read request, data is read at read port 272 from the master storage 117 of the master-shadow physical register file or optionally, in some embodiments, from shadow storage 118 of master-shadow physical register file (as depicted in FIG. 4).

In some embodiments, at block 545, data is retained in the shadow storage 118 until master storage 117 is flushed or the corresponding instruction has successfully retired. In some embodiments, at block 545, when, for example, operating on the same thread, the shadow storage data is retained up until when it is determined that the master shadow has been flushed due to, for example, a wrongly predicted execution from the front end of the machine, which typically initiates a write back into the master storage to recover data from the shadow storage. However, in some embodiments, the master storage 117 does not receive a flush event and the corresponding instruction (second instruction with the same destination ARN) has moved to completion and successful retirement, in which case the shadow storage 118 is retired as well, which brings the state of the MS-PRF back to block 512 (i.e., after, for example, an initial renaming assignment).

In some embodiments, as related to FIGS. 1-5 and exemplified below, a scheme or embodiment is considered the overall configuration of the master-shadow physical register file or master-shadow element of the master-shadow physical register file and a variant is a differentiation in the configuration or use of the scheme. For various schemes that are, for example, exemplified below, consider the following example instruction sequence with reference to FIGS. 1-5:

Instruction 1: Add r1, r2, r3
Instruction 2: Add r2, r3, r3
Instruction 3: jnz target //jump to some location
Instruction 4: Sub r1, r2, r2
Instruction 5: Add r5, r4, r1

Scheme 1: Master-Shadow PRF 151—Shadow PRF 151—Shadow Storage 118 are not Directly Readable Referring to FIGS. 1 and 3, in some embodiments, shadow storage 118 of master shadow PRF 151 is not directly readable during a read operation. In this case, during the read operation attempting to access the data in shadow storage 118, data cannot be read directly from shadow storage 118, but instead data from shadow storage 118 is first transferred to master storage 117, then read from master storage 117. In some embodiments, when the shadow storage 118 is not directly readable, master shadow PRF 151 and shadow storage 118 are associated with the same thread.

Sequence of Operations in the Absence of Flushes

In one embodiment, in the absence of flushes during the execution of instructions 1-5, Instruction 1 is dispatched, decoded by decode unit 108 into a first ARN, a second ARN, and a third ARN, and provided to renaming unit 114 for renaming. After the first PRN and the second PRN are read from RAT map 145, master-shadow controller 115 of renaming unit 114 examines the master free list 141 to determine whether a PRN in master storage 117 is available for renaming the third ARN. A color bit in the transfer indicator 144 corresponding to the physical register number is updated or flipped from a first value (e.g., 0 or BLACK) indicative of the data associated with the PRN being transferred or moved in master storage 117 to a second value (e.g., 1 or RED) indicative of the data associated with the PRN being transferred to shadow storage 118. As stated previously, transfer indicator 144 a vector of bits equal to number of PRNs. In some embodiments, the color bit is flipped on every rename, restored as appropriate on flush, stored in the map tables and retire queue, or used for tracking on flush recovery, etc. In various embodiments, the color bits are stored in, for example, retire queue 113 for identifying which version of the master-storage pair has the data associated with this ARN-PRN mapping. In this case, master-shadow controller 115 determines that PRN 20, color BLACK, of master storage 117 is available for renaming. Thus, the third ARN, i.e., ARN r1 of Instruction 1, is mapped to PRN P20, color BLACK, in RAT map 145 by master-shadow controller 115 examining the master free list 141. Master-shadow controller 115 updates master free list 141 to indicate that PRN 20, color BLACK, is no longer available for renaming.

Subsequently, Instruction 2 is dispatched, decoded by decode unit 108 into a first ARN, a second ARN, and a third ARN, and provided to renaming unit 114 for renaming. After the first PRN and the second PRN are read from RAT map 145, master-shadow controller 115 of renaming unit 114 examines the master free list 141 and determines which PRN in the master storage 117 is available for assignment to the third ARN. In this case, master-shadow controller 115 determines that PRN 21, color BLACK, of master storage 117 is available. Thus, the third ARN, ARN r2 of Instruction 2 is mapped to PRN 21, color BLACK, in RAT map 145. Master-shadow controller 115 updates master free list 141 to indicate that PRN 21, color BLACK, is no longer available.

Subsequently, Instruction 3 is received and is determined to be a jnz target command and not taken. Master-shadow controller 115 proceeds to Instruction 4. Assume that at this point, Instruction 1 has issued and completed. PRN completion vector 143 is updated by master-shadow controller 115 with, for example, a logical bit value of 1, to indicate that Instruction 1 has completed. The result of Instruction 1 is written to the master storage 117 associated with PRN 20. That is, data associated with the ARN r1 of Instruction 1 is written in the master storage 117 associated with PRN 20, also titled PRN 20, color BLACK.

Subsequently, Instruction 4 is dispatched, decoded by decode unit 108 into a first ARN, a second ARN, and a third ARN, and provided to renaming unit 114 for renaming. In some embodiments, after the first PRN and the second PRN are read from RAT map 145, the RAT 145 is used to compare the third ARN of Instruction 4 to the third ARNs, if any, of the previous instructions (e.g., Instructions 1-3) to determine if any of the third ARNs are equivalent to the third ARN of Instruction 4. In this case, the third ARN of Instruction 1 (e.g., r1) is equivalent to the third ARN of Instruction 4 (e.g., r1). Master-shadow controller 115 proceeds to examine whether the previous instruction that corresponds to the matching ARN has completed using PRN completion vector 143.

Master-shadow controller 115 examines or is notified by the PRN completion vector 143 that Instruction 1 has completed and the result has been written to master storage 177 of the master-shadow physical register file 151. Master-shadow controller 115 proceeds to determine whether the shadow storage 118 associated with PRN of the instruction that has completed is available for storage using shadow free list 142.

In this case, master-shadow controller 115 examines the shadow free list 142 and determines whether the shadow storage 118 associated with PRN 20 is available. The shadow free list 142 indicates that the shadow storage 118 associated with PRN 20 is available.

Since the shadow free list 142 indicates that the shadow storage 118 associated with PRN 20 is available, the master storage 117 associated with PRN 20 has been written to (i.e., the completion bit indicates the instruction has completed), and the third ARN of Instruction 4 is equal to the third ARN of Instruction 1, the shadow activation conditions (a first shadow activation event, a second shadow activation event, and a third shadow activation event) have been satisfied and the data stored in master storage 117 associated with the PRN 20 is transferred into the shadow storage 118 associated with PRN 20. Thus, in some embodiments, master storage 117 to shadow storage 118 movement occurs when a new renaming of the third ARN associated with a previous instruction (when two instructions have equivalent third ARNs) occurs, the completion of the previous instruction occurs, and the shadow storage 117 associated with the corresponding PRN is available.

Once the data in the master storage 117 has been transferred to shadow storage 118, the master free list 141 is updated to indicate that the master storage 117 associated with PRN 20 is available for renaming, the shadow free list 142 is updated to indicate that PRN 20 associated with shadow storage 118 is not available for storage, and the transfer indicator 144 is updated to indicate that data in the master storage 117 has been moved to shadow storage 118. That is, since data has been transferred from master storage 117 to shadow storage 118 (in this case, the master storage 117 and shadow storage 118 associated with PRN 20), a color bit in the transfer indicator 144 corresponding to the physical register number, in this case, PRN 20, is updated or flipped from a first value (e.g., 0 or BLACK) indicative of the data associated with PRN 20 being transferred or moved in master storage 117 to a second value (e.g., 1 or RED) indicative of the data associated with PRN 20 being transferred to shadow storage 118. The transfer indicator 144 is a data structure that is read at rename, written into the retire queue 113 corresponding to the instruction, and updated when data in the master storage 117 is moved to shadow storage 118 so that, for example, consecutive assignments of the same PRN (in this case, PRN 20), alternate. In some embodiments, the size of transfer indicator 144 is equal in size to the number of PRNs (e.g., one bit per Master-shadow PRN).

Master-shadow controller 115 of renaming unit 114 examines the master free list 141 to determine whether a PRN in master storage 117 is available for renaming. In this case, since data has been transferred from master storage 117 to shadow storage 118, PRN 20 is available for renaming. As a result, master-shadow controller 115 determines that PRN 20 of master storage 117 is available. Thus, third ARN, i.e., ARN r1 of Instruction 4, is mapped to PRN 20. The color RED is written into the ROB entry corresponding to this instruction, for tracking and flush recovery.

Subsequently, Instruction 1 retires. Retire queue 113 updates the retire map 190 to show that ARN r1 of the first instruction is mapped to PRN 20, color BLACK. Assume Instruction 2 retires. Retire queue 113 updates the retire map 190 to show that ARN r1 of the first instruction is mapped to PRN 21, color BLACK. Instruction 3 and Instruction 4 retire. Retire map 190 is updated to show that the PRN of Instruction 4 has retired.

With reference to Instruction 4 retiring, master-shadow controller 115 notifies the retire map 190 to update that ARN r1 of Instruction 4 is mapped to PRN 20, color RED. That is, retire map 190 now shows that ARN r1 of Instruction 4 is mapped to PRN 20, color RED. PRN 20, color BLACK, being replaced by PRN 20, color RED, and the data associated with PRN, color BLACK in the shadow storage 118, is no longer needed since it has been replaced in the retire map 190 with PRN 20, color RED.

In various embodiments, at this point, master-shadow controller 115 has the option of freeing the shadow storage 118 or using the shadow storage 118 for storage (by transferring data from the master storage 117 to the shadow storage 118). Thus, in one embodiment, master-shadow controller 115 sets the bit corresponding to PRN 20 in the shadow free list 142 to indicate that the corresponding shadow storage 118 is available (PRN 20, color BLACK is no longer required). However, PRN 20 is not available for renaming unless the master storage 117 corresponding to PRN 20 is also made available using the master free list 141.

In another embodiment, master-shadow controller 115 moves the data in the master storage 117 corresponding to PRN 20 to shadow storage 118 and sets the bit corresponding to PRN 20 in the master free list 117 to indicate that master storage 117 associated with PRN 20 is free. In some embodiments, since PRN 20 of master storage 117 is now available, a new operation may select PRN 20 (e.g., PRN 20, color BLACK) as its renamed destination. When master-shadow controller 115 transfers the data in the master storage 117 to shadow storage 118, master-shadow controller 155 flips the value in the transfer indicator 144 corresponding to the physical register number PRN 20 to RED (i.e., PRN 20, color RED).

Sequence of Operations when Instruction 3 is Mispredicted

In one embodiment, the following sequence of operations occur when, for example, Instruction 3 is mispredicted. Instruction 1 is dispatched and decoded by decode unit 108 into a first ARN, a second ARN, and a third ARN, and provided to renaming unit 114 for renaming. After the first PRN and the second PRN are read from RAT map 145, master-shadow controller 115 of renaming unit 114 examines the master free list 141 to determine whether a PRN in master storage 117 is available for renaming the third ARN. In this case, master-shadow controller 115 determines that PRN 20, color BLACK of master storage 117 is available for renaming. Thus, the third ARN, i.e., ARN r1 of Instruction 1, is mapped to PRN 20, color BLACK in RAT map 145. Master-shadow controller 115 updates master free list 141 to indicate that PRN 20, color BLACK is no longer available for renaming.

Subsequently, Instruction 2 is dispatched, decoded by decode unit 108 into a first ARN, a second ARN, and a third ARN, and provided to renaming unit 114 for renaming. Master-shadow controller 115 of renaming unit 114 examines the master free list 141 and determines which PRN in the master storage 117 is available for renaming. In this case, master-shadow controller 115 determines that PRN 21, color BLACK of master storage 117 is available. Thus, the third ARN, ARN r2 of Instruction 2 is mapped to PRN 21, color BLACK in RAT map 145. Master-shadow controller 115 updates master free list 141 to indicate that PRN 21 is no longer available for renaming. In other words, in some embodiments, once PRN 21 is assigned to an ARN in the RAT map 145, PRN 21 is unavailable for renaming until it is moved to shadow and the color does not change at this time.

Instruction 3 is predicted and not taken. Renaming unit 114 proceeds to Instruction 4. Assume that at this point, Instruction 1 has issued and completed. PRN completion vector 143 is updated by master-shadow controller 115 to indicate that Instruction 1 has completed. The result of Instruction 1 is written to the master storage 117 associated with PRN 20, color BLACK. That is, data associated with the ARN r1 of Instruction 1 is written in the master storage 117 associated with PRN 20.

Subsequently, Instruction 4 is dispatched, decoded by decode unit 108 into a first ARN, a second ARN, and a third ARN, and provided to renaming unit 114 for renaming.

In some embodiments, the RAT 145 is used to compare the third ARN of Instruction 4 to the third ARNs, if any, of the previous instructions (e.g., Instructions 1-3) to determine if any of the third ARNs are equivalent to the third ARN of Instruction 4. In this case, the third ARN of Instruction 1 (e.g., r1) is equivalent to the third ARN of Instruction 4 (e.g., r1). Master-shadow controller 115 proceeds to examine whether the previous instruction that corresponds to the matching ARN has completed using PRN completion vector 143.

Master-shadow controller 115 examines or is notified by the PRN completion vector 143 that Instruction 1 has completed and the result has been written to master storage 177 of the master-shadow physical register file 151. Master-shadow controller 115 proceeds to examine the shadow free list 142 to determine whether the shadow storage 118 associated with PRN of Instruction 1 (i.e., the instruction that has completed) is available for storage.

In this case, master-shadow controller 115 examines the shadow free list 142 and determines the shadow storage 118 associated with PRN 20 is available.

Since the shadow free list 142 indicates that the shadow storage 118 associated with PRN 20 is available, the master storage 117 associated with PRN 20 has been written to (i.e., the completion bit indicates the instruction has completed), and the third ARN of Instruction 4 is equal to the third ARN of Instruction 1, the shadow activation conditions (a first shadow activation event, a second shadow activation event, and a third shadow activation event) have been satisfied and the data stored in master storage 117 associated with the PRN 20, color BLACK is transferred into the shadow storage 118 associated with PRN 20.

Once the data in the master storage 117 has been transferred to shadow storage 118, the master free list 141 is updated to indicate that the master storage 117 associated with PRN 20 is available for renaming, the shadow free list 141 is updated to indicate that shadow storage 118 associated with PRN 20 is not available for storage, and the transfer indicator 144 is updated to indicate that data in the master storage 117 has been moved to shadow storage 118. As stated previously, since data has been transferred from master storage 117 to shadow storage 118, in this case, the master storage 117 and shadow storage 118 associated with PRN 20, the color bit in the transfer indicator 144 corresponding to the physical register number, in this case, PRN 20, is updated or flipped from a first value (e.g., 0 or BLACK) indicative of the data associated with PRN 20 being transferred or moved in master storage 117 to a second value (e.g., 1 or RED) indicative of the data associated with PRN 20 being transferred to shadow storage 118.

Master-shadow controller 115 of renaming unit 114 examines the master free list 141 to determine whether a PRN in master storage 117 is available for renaming. In this case, since data has been transferred from master storage 117 to shadow storage 118, PRN 20, color RED is available for renaming. As a result, master-shadow controller 115 determines that PRN 20, color RED of master storage 117 is available. Thus, third ARN, i.e., ARN r1 of Instruction 4, is mapped to PRN 20, color RED in RAT table 145.

At this point, Instruction 3 is executed and found to be taken. As a result, the master-shadow controller 115 reverses or "unwinds" the effect of Instruction 4. In order to reverse the effect of Instruction 4, a flush recovery unit 181 determines that the valid mapping for ARN r1 at Instruction 3 is PRN 20, color BLACK. Master-shadow controller 115 examines the transfer indicator 144 which indicates that the current color for PRN 20 is RED, which means that data from the master storage 117 location PRN 20, color BLACK has been moved to shadow storage 118, thus the data for PRN 20, color BLACK is in the shadow storage 117.

Once master-shadow controller 115 determines that PRN 20, color BLACK has been moved to shadow storage 118, master-shadow controller 115 moves the data in shadow storage 118 back to master storage 117 for PRN 20. Master-shadow controller 115 then updates the shadow free list 142 corresponding to PRN 20 to indicate that the shadow storage 118 is now available. The color bit in transfer indication list 144 is flipped back to BLACK for PRN 20. When another instruction at the taken target of the branch renames to PRN 20, master-shadow controller 115 assigns the ARN to PRN 20, color RED.

Variant 1: Master-Shadow PRF 151—Shadow Storage 118 not Directly Readable—Master Storage 117 and Shadow Storage 118 Mapped to the Same ARN In some embodiments, the master storage 117 and shadow storage 118 are assigned to the same ARN. In this particular variant, the RAT map 147 tracks whether or not the shadow storage 118 is available. When the shadow storage 118 is free, then the data in master storage 117 may be moved to the shadow storage 117. When the shadow storage 118 is occupied or not available, the ARN is mapped to a new PRN. In some embodiments, the transfer indicator 144 (color bit vector) and shadow free list 142 (shadow bit vector) are not required and control is localized to the RAT map 147 and a master-shadow free list 146 and only at dispatch (no retire-time master-shadow movement). The master storage 117 and shadow storage 118 pair are treated as a single entity at all times.

Sequence of Operations in the Absence of Flushes

In some embodiments, as part of the sequence of operations in the absence of flushes, Instruction 1 is dispatched, decoded by decode unit 108 into a first ARN, a second ARN, and a third ARN, and provided to renaming unit 114 renaming. After the first PRN and the second PRN are read from RAT map 147, master-shadow controller 115 of renaming unit 114 examines the master-shadow free list 146 to determine whether a PRN associated with a master storage 117 and a shadow storage 118 is available for renaming the third ARN. In this case, master-shadow controller 115 determines that PRN 20 assigned to master storage 117 and shadow storage 118 is available. Thus, the third ARN, i.e., ARN r1 of Instruction 1, is mapped to PRN 20 in RAT map 147 by examining the master-shadow free list 146. Master-shadow controller 115 updates master-shadow free list 146 to indicate that PRN 20 is no longer available for renaming.

Master-shadow controller 115 assigns a color bit, either RED or BLACK, to the third ARN in RAT map 147. In some embodiments, the color bit is exclusively maintained in the RAT map 147 and a per-PRN vector (i.e., transfer indicator 144) is not required. In this case, master-shadow controller 115 assigns ARN r1 to PRN 20, color BLACK in the RAT map 147.

Subsequently, Instruction 2 is dispatched, decoded by decode unit 108 into a first ARN, a second ARN, and a third ARN, and provided to renaming unit 114 for renaming. After the first PRN and the second PRN are read from RAT map 147, master-shadow controller 115 of renaming unit 114 examines the master-shadow free list 146 and determines which PRN in the master storage 117 is available for assignment to the third ARN. In this case, master-shadow controller 115 determines that PRN 21, color BLACK of master storage 117 is available. Thus, the third ARN, ARN r2 of Instruction 2 is mapped to PRN 21, color BLACK in RAT map 147. Master-shadow controller 115 updates master-shadow free list 146 to indicate that PRN 21, color BLACK is no longer available.

Assume that at this point, Instruction 1 has issued and completed. PRN completion vector 143 is updated by master-shadow controller 115 with, for example, a logical bit value of 1, to indicate that Instruction 1 has completed. The result of Instruction 1 is written to the master storage 117 associated with PRN 20, color BLACK. That is, data associated with the ARN r1 of Instruction 1 is written in the master storage 117 associated with PRN 20, color BLACK.

Assume Instruction 3 is not taken. Subsequently, Instruction 4 is dispatched, decoded by decode unit 108 into a first ARN, a second ARN, and a third ARN, and provided to renaming unit 114 for renaming. In some embodiments, after the first PRN and the second PRN are read from RAT map 147, the RAT 145 is used to compare the third ARN of Instruction 4 to the third ARNs, if any, of the previous instructions (e.g., Instructions 1-3) to determine if any of the third ARNs are equivalent to the third ARN of Instruction 4. In this case, the third ARN of Instruction 1 (e.g., r1) is equivalent to the third ARN of Instruction 4 (e.g., r1). Master-shadow controller 115 proceeds to examine whether the previous instruction that corresponds to the matching ARN has completed using PRN completion vector 143.

Master-shadow controller 115 examines or is notified by the PRN completion vector 143 that Instruction 1 has completed and the result has been written to master storage 177 of the master-shadow physical register file 151. Master-shadow controller 115 proceeds to determine whether the shadow storage 118 associated with PRN of the instruction that has completed is available for storage using RAT map 147.

In this case, master-shadow controller 115 examines the RAT map 147 and determines whether the shadow storage 118 associated with PRN 20 is available. The RAT map 147 indicates that the shadow storage 118 associated with PRN 20 is available.

Since the RAT map 147 indicates that the shadow storage 118 associated with PRN 20 is available, the master storage 117 associated with PRN 20 has been written to (i.e., the completion bit indicates the instruction has completed), and the third ARN of Instruction 4 is equal to the third ARN of Instruction 1, the shadow activation conditions (a first shadow activation event, a second shadow activation event, and a third shadow activation event) have been satisfied and the data stored in master storage 117 associated with the PRN 20 is transferred into the shadow storage 118 associated with PRN 20. That is, PRN 20 of shadow storage 118 is free, so master-shadow controller 115 moves data from the master storage 117 to the shadow storage 118 and flips the color bit from BLACK to RED in RAT map 147. Since data has been transferred the master storage 117 associated with PRN 20 to shadow storage 118, the master storage 117 associated with PRN 20 is now available for renaming and ARN r1 of Instruction 4 is renamed to PRN 20.

ARN r1 in RAT map 147 is now mapped to PRN 20, color RED. In this case, the red color indicates that PRN 20 master storage 117 and shadow storage 118 are occupied. Any other op renaming ARN r1 must pick a different PRN whose master storage 117 and shadow storage 118 are both free, as indicated by master-shadow free list 146.

Subsequently, Instruction 1 retires. Retire queue 113 updates the retire map 190 to show that ARN r1 of the first instruction is mapped to PRN 20, color BLACK. That is, Instruction 1 retires, and retire map 147 indicates that r1 is assigned to PRN 20, color BLACK. Assume Instruction 2 retires. Retire queue 113 updates the retire map 190 to show that ARN r1 of the first instruction is mapped to PRN 21, color BLACK. Instruction 3 and Instruction 4 retire. Retire map 190 is updated to show that the PRN of Instruction 4 has retired.

With reference to Instruction 4 retiring, master-shadow controller 115 notifies the retire map 190 to update that ARN r1 of Instruction 4 is mapped to PRN 20, color RED. That is, retire map 190 now shows that ARN r1 of Instruction 4 is mapped to PRN 20, color RED. At this point the master storage 117 and shadow storage 118 associated with PRN 20 are both freed by master-shadow controller 115 and available for renaming.

Sequence of Operations when Instruction 3 is Mispredicted

In some embodiments, as part of the sequence of operations when Instruction 3 is mispredicted, Instruction 1 is dispatched, decoded by decode unit 108 into a first ARN, a second ARN, and a third ARN, and provided to renaming unit 114 renaming. After the first PRN and the second PRN are read from RAT map 147, master-shadow controller 115 of renaming unit 114 examines the master-shadow free list 146 to determine whether a PRN associated with a master storage 117 and a shadow storage 118 is available for renaming the third ARN. In this case, master-shadow controller 115 determines that PRN 20, color BLACK assigned to master storage 117 and shadow storage 118 is available. Thus, the third ARN, i.e., ARN r1 of Instruction 1, is mapped to PRN P20, color BLACK in RAT map 147 by examining the master-shadow free list 146. Master-shadow controller 115 updates master-shadow free list 146 to indicate that PRN 20 is no longer available for renaming.

Subsequently, Instruction 2 is dispatched, decoded by decode unit 108 into a first ARN, a second ARN, and a third ARN, and provided to renaming unit 114 for renaming. Master-shadow controller 115 of renaming unit 114 examines the master-shadow free list 146 and determines which PRN in the master storage 117 is available. In this case, master-shadow controller 115 determines that PRN 21 of master storage 117 is available. Thus, the third ARN, ARN r2 of Instruction 2 is mapped to PRN 21, color BLACK in RAT map 147. Master-shadow controller 115 updates master-shadow free list 146 to indicate that PRN 21, color BLACK is no longer available.

Assume that at this point, Instruction 1 has issued and completed. PRN completion vector 143 is updated by master-shadow controller 115 with to indicate that Instruction 1 has completed. The result of Instruction 1 is written to the master storage 117 associated with PRN 20, color BLACK. That is, data associated with the ARN r1 of Instruction 1 is written in the master storage 117 associated with PRN 20, color BLACK.

Subsequently, Instruction 3 is dispatched and mispredicts. Instruction 4 is dispatched, decoded by decode unit 108 into a first ARN, a second ARN, and a third ARN, and provided to renaming unit 114 for renaming. In some embodiments, after the first PRN and the second PRN are read from RAT map 147, the RAT 145 is used to compare the third ARN of Instruction 4 to the third ARNs, if any, of the previous instructions (e.g., Instructions 1-3) to determine if any of the third ARNs are equivalent to the third ARN of Instruction 4. In some embodiments, the comparison tracking occurs during register renaming. In this case, the third ARN of Instruction 1 (e.g., r1) is equivalent to the third ARN of Instruction 4 (e.g., r1). Master-shadow controller 115 proceeds to examine whether the previous instruction that corresponds to the matching ARN has completed using PRN completion vector 143.

Master-shadow controller 115 examines or is notified by the PRN completion vector 143 that Instruction 1 has completed and the result has been written to master storage 177 of the master-shadow physical register file 151. Master-shadow controller 115 proceeds to determine whether the shadow storage 118 associated with PRN of the instruction that has completed is available for storage using shadow free list 142.

In this case, master-shadow controller 115 examines the RAT map 147 and determines whether the shadow storage 118 associated with PRN 20 is available. The RAT map 147 indicates that the shadow storage 118 associated with PRN 20 is available.

Since the RAT map 147 indicates that the shadow storage 118 associated with PRN 20 is available, the master storage 117 associated with PRN 20 has been written too (i.e., the completion bit indicates the instruction has completed), and the third ARN of Instruction 4 is equal to the third ARN of Instruction 1, the shadow activation conditions (a first shadow activation event, a second shadow activation event, and a third shadow activation event) have been satisfied and the data stored in master storage 117 associated with the PRN 20 is transferred into the shadow storage 118 associated with PRN 20. Since data has been transferred from the master storage 117 associated with PRN 20 to shadow storage 118, the master storage 117 associated with PRN 20 is now available for renaming and ARN r1 of Instruction 4 is renamed to PRN 20, color RED.

Instruction 3 mispredicts and the flush recovery unit 181 determines that the valid mapping for r1 is PRN 20, color BLACK. However, the RAT map 147 has the mapping of r1 being PRN 20, color RED, which means master-shadow controller 115 is to restore the data that is in shadow storage 118 to master storage 117. The RAT map 147 is updated such that r1 is mapped to PRN 20, color BLACK. In this case, when another instruction renames r1, data is moved from master storage 117 to shadow storage 118 and ARN r1 is assigned to PRN 20, color RED.

Variant 2: Execution Master-Storage PRF 151, Shadow Storage 118 not Readable

In some embodiments, scheme 1 works for a dispatch PRF, but not for an execution PRF, unless scheme 1 is adapted as is disclosed in variant 2. The difference between an execution PRF is that an execution PRF is read at issue by the fixed-point unit 112, which is out-of-order, whereas a dispatch PRF is read at dispatch by the fixed-point unit 112, in program order. In some embodiments, with an execution PRF, the fixed-point unit 112 waits until all reads of the PRN have completed in the scheduler unit 128 and the PRN is no longer referenced in the RAT map 145 to trigger a master storage 117 to shadow storage 118 move or transfer.

In some embodiments, a lookup table (not shown) is examined by master-shadow controller 115 to determine if the PRN is sourced by an op in the scheduler unit 128. In some embodiments, a reference vector 148 is added to equal to the number of elements in the PRF to track whether the PRN is no longer referenced. If the reference vector 148 for a PRN is set or asserted, then the master storage 117 is no longer referenced in the PRF and data in the master storage 117 is moved to the shadow storage 118. In some embodiments, the PRN completion vector 143 (e.g., a completion bit vector) is not utilized in this case because the instruction is already being tracked by the reference vector 148.

In some embodiments, a 2-Dimensional (2-D) matrix of bits is utilized, with columns equal to the number of scheduler unit 128 entries and rows equal to the number of PRNs. In some embodiments, when an op is written into the scheduler unit 128, the bit corresponding to the PRNs the op sources are set. In some embodiments, OR'ing all the bits in a row yields whether the PRN is being used in the scheduler unit 128.

Alternatively, in some embodiments, a 2D matrix of bits is utilized with rows equal to the number of scheduler entries and two columns, one for each PRN (encoded in binary). In some embodiments, when an op completes, the op takes each source PRN and CAMs this structure to determine if the PRN is still present. When the PRN is absent, an entry is deallocated by master-shadow controller 115.

Sequence of Operations in the Absence of Flushes

In one embodiment, in the absence of flushes during the execution of instructions 1-5, Instruction 1 is dispatched, decoded by decode unit 108 into a first ARN, a second ARN, and a third ARN, and provided to renaming unit 114 for renaming. After the first PRN and the second PRN are read from RAT map 145, ARN r1 is mapped to PRN 20, color BLACK. Master-shadow controller 115 updates master free list 141 to indicate that PRN 20, color BLACK is no longer available.

Subsequently, Instruction 2 is dispatched, decoded by decode unit 108 into a first ARN, a second ARN, and a third ARN, and provided to renaming unit 114 for renaming. After the first PRN and the second PRN are read, master-shadow controller 115 determines that PRN 21 of master storage 117 is available for renaming and updates master free list 141 to indicate that PRN 21 is no longer available. That is, master-shadow controller 115 determines that PRN 21 is available for renaming and then updates to indicate its unavailable. In addition, the renaming unit 114 assigned PRN 21, color BLACK to ARN r2 and then the PRN is marked as unavailable.

Instruction 3 is received and is determined to be a jnz target command and not taken. Master-shadow controller 115 proceeds to Instruction 4.

Instruction 4 is dispatched, decoded by decode unit 108 into a first ARN, a second ARN, and a third ARN, and provided to renaming unit 114 for renaming. After assigning the first ARN and the second ARN to PRNs, master-shadow controller 115 examines a reference bit in reference vector 148 to determine whether a PRN is available for renaming. In this case, PRN availability for renaming unit 114 is provided from master free list 141. The master free list 141 the data in the master storage is moved to shadow storage. In some embodiments, the role of the master shadow controller 115 is to ensure the data in the master storage is moved to shadow storage when, for example, it is no longer referenced in the RAT map 145, there are no references to it in the scheduler (i.e., no op uses it as a source), and shadow storage is available. In some embodiments, the transfer occurs independent of rename and, when the transfer occurs, the associated color bit is flipped. In some embodiments, determining whether PRN 20 or PRN 31 is available is done using the master free list 141. In some embodiments, if the master shadow controller 115 sets the bit associated with the master, the PRN is utilized for renaming. In some embodiments, master-shadow controller 115 determines that PRN 31 is available because the reference vector 148 indicates that there are no ops using PRN 31 in the scheduler unit 128. Thus, ARN r1 of Instruction 4 is mapped to PRN 31 in RAT map 145.

Assume Instruction 1 has issued and completed. At this point, Instruction 2 is still in scheduler unit 128 and sources PRN 20, i.e., ARN r1 is a source for Instruction 2. Thus, master-shadow controller determines that PRN 20 cannot yet be moved to the shadow 128.

Assume Instruction 2 has issued and completed. At this point, there are no references to PRN 20, color BLACK in scheduler unit 128 and PRN 20, color BLACK is not referenced in the RAT map 145. Thus, master-shadow controller 115 moves data from master storage 117 to shadow storage 118 for PRN 20, flips the color bit in transfer indicator 144, and updates the master free list 141 to indicate that PRN 20 of master storage 117 is available.

Instruction 5 is renamed and ARN r5 is mapped to PRN 20, color RED in RAT map 145. In some embodiments, flush recovery for variant 1 is identical to the flush recovery for variant 1 described previously with regards to the master-shadow PRF 151. In some embodiments, the reference vector 148 is generated dynamically (i.e. recomputed every cycle), thus allowing the reference vector 148 to correct itself during a flush.

Variant 3: Master-Shadow PRF 151, Shadow Storage 118 not Readable, Transfer at Retire-Time Only In some embodiments, data is transferred from master storage 117 to shadow storage 118 at retire time. When an op is retired in retire map 190, data in master storage 117 is transferred to shadow storage 118 and master-shadow controller 115 updates master free list 141 to indicate that master storage 117 is available for the designated PRN, i.e., returns the master storage 117 to the master free list 141.

Scheme 2—Master Shadow PRF 151—Shadow Storage 118 Directly Readable

Referring to FIGS. 1 and 4, in some embodiments, both master storage 117 and shadow storage 118 are directly readable during a read operation and utilize an early select signal 492 to select whether the master storage 117 or shadow storage 118 is being read. In some embodiments, the basic operation of scheme 2 is similar to that of scheme 1 described above, except without the restriction of having both master storage 117 and shadow storage 118 associated with the same thread. For example, a first thread (e.g., Thread 0) is able to move data from master storage 117 to shadow storage 118 for a first PRN (e.g., PRN 100), and a second thread (e.g., thread 1) is able to rename to the master storage 117 for the first PRN (e.g., PRN 100). In some embodiments, each entry is able to be flushed or invalidated independently of the other.

An additional data structure, a TID mask 149, is included in renaming unit 114 to associate the master storage 117 with a particular thread or threads. The TID mask 149 is a vector that includes one bit per PRN indicating whether the master storage 117 is associated with or belongs to the first thread (e.g., thread 0) or the second thread, (e.g., thread 1). When a thread is selected for dispatch, the TID mask 149 is applied so that the appropriate entry for the appropriate thread is selected.

In some embodiments, during a first scenario, both master storage 117 and shadow storage 118 are associated with the first thread (the same thread). Entries in the shadow storage 118 are not read directly, thus only the master storage 117 is read during a read operation. In this case, master-shadow controller 155 utilizes the TID mask 149 to select the master storage 117 when the master storage 117 is associated with the first thread (the same thread) as the thread being dispatched.

In some embodiments, during a second scenario, master storage 117 and shadow storage 118 are associated with unique threads or different threads (e.g., a first thread and a second thread). In some embodiments, master-shadow controller 115 uses the TID mask 149 to select the appropriate entry to read. In some embodiments, scheme 2 is operation only for in-order operations, i.e., scheme 2 is applicable for dispatch PRF but not execution PRF. In some embodiments, variant 3 from scheme 1 described above is applicable to scheme 2. In some embodiments, the general operation is similar to that of scheme 1, except that there is a change in the operation in the presence of a flush operation.

Sequence of Operations when Instruction 3 is Mispredicted

In one embodiment, the following sequence occurs, when, for example, Instruction 3 of Instructions 1-5 is mispredicted. Instruction 1 is dispatched and decoded by decode unit 108 into a first ARN, a second ARN, and a third ARN, and provided to renaming unit 114 for renaming. After the first PRN and the second PRN are read from RAT map 145, master-shadow controller 115 of renaming unit 114 examines the master free list 141 to determine whether a PRN in master storage 117 is available for renaming the third ARN. In this case, master-shadow controller 115 determines that PRN 20, color BLACK of master storage 117 is available for renaming. Thus, the third ARN, i.e., ARN r1 of Instruction 1, is mapped to PRN 20, color BLACK in RAT map 145. Master-shadow controller 115 updates master free list 141 to indicate that PRN 20, color BLACK is no longer available for renaming.

Subsequently, Instruction 2 is dispatched, decoded by decode unit 108 into a first ARN, a second ARN, and a third ARN, and provided to renaming unit 114 for renaming. Master-shadow controller 115 of renaming unit 114 examines the master free list 141 and determines which PRN in the master storage 117 is available. In this case, master-shadow controller 115 determines that PRN 21, color BLACK of master storage 117 is available. Thus, the third ARN, ARN r2 of Instruction 2 is mapped to PRN 21, color BLACK in RAT map 145.

Instruction 3 is predicted and not-taken. Renaming unit 114 proceeds to Instruction 4. Assume that at this point, Instruction 1 has issued and completed. PRN completion vector 143 is updated by master-shadow controller 115 to indicate that Instruction 1 has completed. The result of Instruction 1 is written to the master storage 117 associated with PRN 20, color BLACK. That is, data associated with the ARN r1 of Instruction 1 is written in the master storage 117 associated with PRN 20, color BLACK.

Subsequently, Instruction 4 is dispatched, decoded by decode unit 108 into a first ARN, a second ARN, and a third ARN, and provided to renaming unit 114 for renaming.

In some embodiments, the RAT 145 is used to compare the third ARN of Instruction 4 to the third ARNs, if any, of the previous instructions (e.g., Instructions 1-3) to determine if any of the third ARNs are equivalent to the third ARN of Instruction 4. In this case, the third ARN of Instruction 1 (e.g., r1) is equivalent to the third ARN of Instruction 4 (e.g., r1). Master-shadow controller 115 proceeds to examine whether the previous instruction that corresponds to the matching ARN has completed using PRN completion vector 143.

Master-shadow controller 115 examines or is notified by the PRN completion vector 143 that Instruction 1 has completed and the result has been written to master storage 177 of the master-shadow physical register file 151. Master-shadow controller 115 proceeds to examine the shadow free list 142 to determine whether the shadow storage 118 associated with PRN of the instruction that has completed is available for storage.

In this case, master-shadow controller 115 examines the shadow free list 142 and determines the shadow storage 118 associated with PRN 20 is available.

Since the shadow free list 142 indicates that the shadow storage 118 associated with PRN 20 is available, the master storage 117 associated with PRN 20 has been written too (i.e., the completion bit indicates the instruction has completed), and the third ARN of Instruction 4 is equal to the third ARN of Instruction 1, the shadow activation conditions (a first shadow activation event, a second shadow activation event, and a third shadow activation event) have been satisfied and the data stored in master storage 117 associated with the PRN 20 is transferred into the shadow storage 118 associated with PRN 20.

Once the data in the master storage 117 has been transferred to shadow storage 118, the master free list 141 is updated to indicate that PRN 20 is available for renaming, shadow storage 118 is updated to indicate that PRN 20 is not available for storage, and the transfer indicator 144 is updated to indicate that data in the master storage 117 has been moved to shadow storage 118. As stated previously, since data has been transferred from master storage 117 to shadow storage 118, in this case, the master storage 117 and shadow storage 118 associated with PRN 20, the color bit in the transfer indicator 144 corresponding to the physical register number, in this case, PRN 20, is updated or flipped from a first value (e.g., 0 or black) indicative of the data associated with PRN 20 being transferred or moved in master storage 117 to a second value (e.g., 1 or red) indicative of the data associated with PRN 20 being transferred to shadow storage 118.

Master-shadow controller 115 of renaming unit 114 examines the master free list 141 to determine whether a PRN in master storage 117 is available for renaming. In this case, since data has been transferred from master storage 117 to shadow storage 118, PRN 20 is available for renaming. As a result, master-shadow controller 115 determines that PRN 20 of master storage 117 is available. Thus, third ARN, i.e., ARN r1 of Instruction 4, is mapped to PRN P20 in RAT table 145, also titled PRN 20, color RED.

At this point, Instruction 3 is executed and found to be taken by fixed-point unit 112. As a result, the fixed-point unit 112 reverses or "unwinds" the effect of Instruction 4. In some embodiments, a flush recovery unit 181 determines that the valid mapping for ARN r1 at Instruction 3 is PRN 20, color BLACK. However, master-shadow controller 115 examines the transfer indicator 144 which indicates that the current color for PRN 20 is RED, which means that data from the master storage 117 location PRN 20, color BLACK has been moved to shadow storage 118, thus PRN 20, color BLACK must be in the shadow storage 117.

At this point, if master storage 117 and shadow storage 118 are associated with the same thread (the first thread), master-shadow controller 115 flips the color bit in transfer indicator 144 from RED back to BLACK and move data from master storage 117 to transfer storage 118 (similar to scheme 1). If master storage 117 and shadow storage 118 are associated with different threads (i.e., a first thread and a second thread), the TID mask 149 selects either the master storage 117 or the shadow storage 118 as appropriate. When another instruction at the taken target of the branch renames to PRN 20, master-shadow controller 115 assigns the ARN to PRN 20, color RED.

In some embodiments, the apparatus and techniques described above are implemented in a system including one or more integrated circuit (IC) devices (also referred to as integrated circuit packages or microchips), such as the processor described above with reference to FIGS. 1-5. In some embodiments, variant 3, described above, also applies to scheme 2. Electronic design automation (EDA) and computer aided design (CAD) software tools may be used in the design and fabrication of these IC devices. These design tools typically are represented as one or more software programs. The one or more software programs include code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any non-transitory storage medium, or combination of non-transitory storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

In some embodiments, certain aspects of the techniques described above may implemented by one or more processors of a processing system executing software. The software includes one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A processor, comprising:
   a master-shadow physical register file, the master-shadow physical register file having master storage coupled to shadow storage; and
   a renaming unit coupled to the master-shadow physical register file wherein, based on an occurrence of shadow transfer activation conditions verified by the renaming unit, data in the master storage is transferred from the master storage to the shadow storage for storage, wherein the shadow transfer activation conditions are based on a resultant architectural register number (ARN).

2. The processor of claim 1, wherein:
   after a shadow-to-master transfer event has occurred, the data in the shadow storage is transferred to the master storage.

3. The processor of claim 1, wherein:
the shadow transfer activation conditions include a determination that the shadow storage associated with the master storage is available for data storage.

4. The processor of claim 1, wherein:
the master storage and the shadow storage are associated with a single architectural register number (ARN).

5. The processor of claim 1, wherein:
data is transferred from the master storage to the shadow storage upon retire of a first instruction.

6. The processor of claim 1, wherein:
the shadow storage is read using an early select signal.

7. The processor of claim 1, wherein:
at least a first reference in a plurality of references located in a scheduler unit coupled to the renaming unit is used to transfer the data.

8. The processor of claim 7, wherein:
the first reference indicates whether the data is used by another instruction.

9. The processor of claim 1, wherein:
the shadow transfer activation conditions include a determination that an instruction has completed.

10. The processor of claim 1, wherein:
the shadow transfer activation conditions include a determination that a second resultant ARN of a second instruction is equivalent to a first ARN of a first instruction.

11. The processor of claim 10, wherein:
the first ARN of the first instruction is renamed to a first physical register number (PRN) associated with a first master-shadow physical register in the master-shadow physical register file.

12. The processor of claim 10, wherein:
the shadow transfer activation conditions require at least each of a determination that the first instruction has completed, the determination that a second resultant ARN of a second instruction is equivalent to a first ARN of a first instruction, and a determination that the shadow storage associated with the master storage is available for data storage.

13. The processor of claim 10, wherein:
the second resultant ARN indicates a location where a result of execution of an operation of the second instruction is to be stored and the first ARN indicates a location where a result of execution of an operation of the first instruction is to be stored.

14. The processor of claim 10, wherein:
the renaming unit renames the second resultant ARN of the second instruction to a physical register number of the master storage from which data has been transferred to shadow storage.

15. The processor of claim 1, wherein:
in response to a flush event of the master storage or a misprediction, data in the shadow storage is transferred to the master storage.

16. A method, comprising:
verifying, at a renaming unit associated with a processor, occurrence of shadow transfer activation conditions, wherein the shadow transfer activation conditions are based on a resultant architectural register number (ARN); and
in response to the verifying, transferring data in a master storage portion of a physical register file of the processor to a shadow storage portion of the physical register file, wherein the master storage portion is coupled to the shadow storage portion.

17. A non-transitory computer readable medium embodying a set of executable instructions, the set of executable instructions to manipulate a renaming unit associated with a processor to:
verify occurrence of shadow transfer activation conditions, wherein the shadow transfer activation conditions are based on a resultant architectural register number (ARN); and
in response to the verification, transfer data in a master storage portion of a physical register file of the processor to a shadow storage portion of the physical register file, wherein the master storage portion is coupled to the shadow storage portion.

* * * * *